(12) United States Patent
Sulewski et al.

(10) Patent No.: US 12,308,037 B2
(45) Date of Patent: May 20, 2025

(54) REDUCED MULTIDIMENSIONAL INDICES COMPRESSION FOR AUDIO CODEC SYSTEM

(71) Applicant: Cisco Technology, Inc., San Jose, CA (US)

(72) Inventors: Michal Sulewski, Gdańsk (PL); Marcin Ciolek, Gdansk (PL); Mihailo Kolundzija, Lausanne (CH); Raul A. Casas, Doylestown, PA (US); Samer Lutfi Hijazi, San Jose, CA (US); Christopher Rowen, Santa Cruz, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 18/540,084

(22) Filed: Dec. 14, 2023

(65) Prior Publication Data

US 2025/0131930 A1    Apr. 24, 2025

Related U.S. Application Data

(60) Provisional application No. 63/591,247, filed on Oct. 18, 2023.

(51) Int. Cl.
*H03M 7/00* (2006.01)
*G10L 19/022* (2013.01)
(Continued)

(52) U.S. Cl.
CPC .......... *G10L 19/022* (2013.01); *G10L 19/038* (2013.01); *G10L 2019/0002* (2013.01); *H03M 7/00* (2013.01); *H03M 7/46* (2013.01)

(58) Field of Classification Search
CPC ................. H03M 7/00; H03M 7/46
See application file for complete search history.

(56) References Cited

U.S. PATENT DOCUMENTS

| 10,991,379 B2 | 4/2021 | Hijazi et al. |
| 11,682,400 B1 | 6/2023 | Liu et al. |

(Continued)

FOREIGN PATENT DOCUMENTS

| WO | 2010040522 A2 | 4/2010 |
| WO | 2019213021 A1 | 11/2019 |
| WO | 2023177803 A1 | 9/2023 |

OTHER PUBLICATIONS

Lincoln, "An Experimental High Fidelity Perceptual Audio Coder," Music 420 Project, Stanford Univ., Mar. 1998. (Year: 1998).*

(Continued)

*Primary Examiner* — Feng-Tzer Tzeng
(74) *Attorney, Agent, or Firm* — Edell, Shapiro & Finnan, LLC

(57) ABSTRACT

A method comprises: storing n dimension (nD) dictionaries (nD dictionaries) where n decreases from a highest dimension to a lowest dimension, each nD dictionary including codewords for sequences of n symbols that are of a limited number that is less than all possible sequences of n symbols; storing key blocks for corresponding ones of the nD dictionaries, each key block configured with keys that map sequences of n−1 symbols to dictionaries of a corresponding one of the nD dictionaries that includes the codewords; receiving a sequence of symbols that represent indices of codevectors of a vector quantizer codebook that are representative of audio; determining a codeword using the key blocks and the nD dictionaries; and encoding a current symbol of the sequence of symbols using the codeword.

27 Claims, 8 Drawing Sheets

(51) Int. Cl.
G10L 19/038 (2013.01)
G10L 19/00 (2013.01)
H03M 7/46 (2006.01)

(56) References Cited

U.S. PATENT DOCUMENTS

| | | | |
|---|---|---|---|
| 2004/0102972 A1 | 5/2004 | Droppo et al. | |
| 2007/0279261 A1* | 12/2007 | Todorov | H03M 7/46 341/51 |
| 2011/0029317 A1 | 2/2011 | Chen et al. | |
| 2014/0191888 A1* | 7/2014 | Klejsa | H04N 19/463 341/107 |
| 2015/0095035 A1 | 4/2015 | Shechtman | |
| 2016/0148618 A1 | 5/2016 | Huang et al. | |
| 2018/0308497 A1 | 10/2018 | Chau et al. | |
| 2020/0186164 A1* | 6/2020 | Marpe | H03M 7/55 |
| 2020/0219519 A1 | 7/2020 | Wang | |
| 2020/0234720 A1 | 7/2020 | Sung et al. | |
| 2021/0125622 A1 | 4/2021 | Zhao | |
| 2021/0256961 A1 | 8/2021 | Garman et al. | |
| 2023/0019128 A1 | 1/2023 | Zeghidour et al. | |
| 2023/0148275 A1 | 5/2023 | Kim et al. | |
| 2023/0186927 A1 | 6/2023 | Zeghidour et al. | |
| 2023/0238011 A1 | 7/2023 | Villemoes et al. | |
| 2023/0260524 A1 | 8/2023 | Multrus et al. | |

OTHER PUBLICATIONS

Mentzer, et al., "Conditional Probability Models for Deep Image Compression," CVPR, 2018. (Year: 2018).*
Valin, J.M., et al., "LPCNET: Improving Neural Speech Synthesis Through Linear Prediction," https://arxiv.org/abs/1810.11846, Feb. 19, 2019, 5 pages.
Jiang, X., et al., "Latent-Domain Predictive Neural Speech Coding," https://arxiv.org/pdf/2207.08363.pdf, May 22, 2023, 12 pages.
Zeghidour, N., et al., "SoundStream: An End-to-End Neural Audio Codec," https://arxiv.org/pdf/2107.03312.pdf, IEEE/ACM Transactions on Audio, Speech, and Language Processing Jul. 7, 2021, 12 pages.
Défossez, A., et al., "High Fidelity Neural Audio Compression," https://export.arxiv.org/abs/2210.13438, Oct. 24, 2022, 19 pages.
Dietz, M., et al., "Overview of the EVS codec architecture," https://ieeexplore.ieee.org/document/7179063/, 2015 IEEE International Conference on Acoustics, Speech and Signal Processing (ICASSP), Apr. 2015, 5 pages.
Valin, J.M., et al., "Definition of the Opus Audio Codec," RFC 6716, https://datatracker.ietf.org/doc/html/rfc6716, Sep. 2012, 326 pages.
Mermelstein, P., "G.722: a new CCITT coding standard for digital transmission of wideband audio signals," IEEE Communications Magazine, vol. 26, No. 1, https://ieeexplore.ieee.org/document/417, Jan. 1988, pp. 8-15.
Oord, A. v.d., et al., "WaveNet: A Generative Model for Raw Audio," https://arxiv.org/abs/1609.03499, Sep. 19, 2016, 15 pages.
Kleijn, W.B., et al. "Wavenet Based Low Rate Speech Coding," 2018 IEEE international conference on acoustics, speech and signal processing (ICASSP), https://arxiv.org/abs/1712.01120, Dec. 2017, 5 pages.
Gray, R., "Vector quantization," https://ieeexplore.ieee.org/document/1162229, Abstract, Apr. 1984, 4 pages.
Valin, J.M., et al., "Low-Bitrate Redundancy Coding of Speech Using a Rate-Distortion-Optimized Variational Autoencoder," ICASSP 2023-2023 IEEE International Conference on Acoustics, Speech and Signal Processing (ICASSP), https://arxiv.org/abs/2212.04453, Feb. 24, 2023, 5 pages.
Bengio, Y., et al., "Estimating or Propagating Gradients Through Stochastic Neurons for Conditional Computation," https://arxiv.org/abs/1308.3432, Aug. 15, 2013, 12 pages.
Oord, A. v.d., et al., "Neural Discrete Representation Learning," Advances in neural information processing systems, vol. 30, https://arxiv.org/abs/1711.00937, May 30, 2018, 11 pages.
Jang, E., et al., "Categorical Reparameterization with Gumbel-Softmax," https://arxiv.org/abs/1611.01144, Aug. 5, 2017, 13 pages.
Liu, D., et al., "Discrete-Valued Neural Communication," https://arxiv.org/abs/2107.02367, Advances in Neural Information Processing Systems, vol. 34, Jul. 10, 2021, pp. 2109-2121.
Vaswani, A., et al., "Attention Is All You Need," 31st Conference on Neural Information Processing Systems (NIPS 2017), https://arxiv.org/abs/1706.03762, Dec. 2017, 15 pages.
Vasuki, A., et al., "A review of vector quantization techniques," https://ieeexplore-dev.ieee.org/document/1664069, Abstract, Jul. 31, 2006, 4 pages.
Choi, H.-S., et al., "Phase-aware Speech Enhancement with Deep Complex U-Net," International Conference on Learning Representations, https://arxiv.org/abs/1903.03107, Mar. 7, 2019, 20 pages.
Salimans, T., et al., "Improved Techniques for Training GANs," Advances in neural information processing systems, vol. 29, https://arxiv.org/abs/1606.03498, Jun. 10, 2016, 10 pages.
Kumar, K., et al., "MelGAN: Generative Adversarial Networks for Conditional Waveform Synthesis," https://arxiv.org/abs/1910.06711, Advances in neural information processing systems, vol. 32, Dec. 9, 2019, 14 pages.
Salimans, T., et al., "Weight Normalization: A Simple Reparameterization to Accelerate Training of Deep Neural Networks," Advances in neural information processing systems, vol. 29, https://arxiv.org/abs/1602.07868, Jun. 4, 2016, 11 pages.
Habets, E.A.P., "Room Impulse Response Generator," https://www.researchgate.net/publication/259991276_Room_Impulse_Response_Generator, Sep. 20, 2010, 21 pages.
Grondin, F., et al., "BIRD: Big Impulse Response Dataset," https://arxiv.org/abs/2010.09930, Oct. 19, 2020, 5 pages.
Liu, L., et al., "On the Variance of the Adaptive Learning Rate and Beyond," https://arxiv.org/abs/1908.03265, Oct. 26, 2021, 14 pages.
The ITU Radiocommunication Assembly, "Method for the subjective assessment of intermediate quality level of coding systems," retrieved from https://www.itu.int/rec/R-REC-BS.1534-1-200301-S/en, Dec. 12, 2023, 18 pages.
International Telecommunication Union, P. 863, "Perceptual Objective Listening Quality Assessment," P.863 : Perceptual objective listening quality assessment (itu.int), Jan. 2011, 76 pages.
Hines, A., et al., "ViSQOL: an objective speech quality model," EURASIP Journal on Audio, Speech, and Music Processing, https://asmp-eurasipjournals.springeropen.com/articles/10.1186/s13636-015-0054-9, May 17, 2015, 18 pages.
Lin, J., et al., "A Time-Domain Convolutional Recurrent Network for Packet Loss Concealment," Abstract, https://ieeexplore.ieee.org/document/9413595, Jun. 2021, 4 pages.
Pascual, S., et al., "Adversarial Auto-Encoding for Packet Loss Concealment," 2021 IEEE Workshop on Applications of Signal Processing to Audio and Acoustics (WASPAA), https://www.semanticscholar.org/reader/935c9e7a6d974707330fd40a3bdb279f4c0863a9, Jul. 8, 2021, pp. 71-75.
Mohamed, M., et al., "ConcealNet: An End-to-end Neural Network for Packet Loss Concealment in Deep Speech Emotion Recognition," https://arxiv.org/abs/2005.07777, May 15, 2020, 5 pages.
Lecomte, J., et al., "Packet-loss concealment technology advances in EVS," 2015 IEEE International Conference on Acoustics, Speech and Signal Processing (ICASSP), https://www.semanticscholar.org/paper/Packet-loss-concealment-technology-advances-in-EVS-Lecomte-Vaillancourt/b74f725cd349caf3505092157cc43aefd1811b4c, Apr. 2015, pp. 5708-5712.
Kazakos, E., et al., "Slow-Fast Auditory Streams for Audio Recognition," https://arxiv.org/pdf/2103.03516.pdf, Mar. 5, 2021, 7 pages.
Li, B., et al., "TranSFormer: Slow-Fast Transformer for Machine Translation," https://arxiv.org/abs/2305.16982, May 26, 2023, 12 pages.
Mujika, A., et al., "Fast-Slow Recurrent Neural Networks," https://arxiv.org/pdf/1705.08639.pdf, Jun. 9, 2017, 10 pages.
Ba, J., et al., "Using Fast Weights to Attend to the Recent Past," https://arxiv.org/abs/1610.06258, Dec. 5, 2016, 10 pages.

(56) References Cited

OTHER PUBLICATIONS

Tjandra, A., et al., "Unsupervised Learning of Disentangled Speech Content and Style Representation," https://arxiv.org/pdf/2010.12973.pdf, Jun. 20, 2021, 5 pages.

An, X., et al., "Disentangling Style and Speaker Attributes for TTS Style Transfer," https://arxiv.org/pdf/2201.09472.pdf, Jan. 24, 2022, 13 pages.

Yuan, S., et al., "Improving Zero-Shot Voice Style Transfer via Disentangled Representation Learning," https://openreview.net/pdf?id=TgSVWXw22FQ, Jan. 2021, 12 pages.

Perkins, C., et al., "RTP Payload for Redundant Audio Data," RFC 2198, https://dl.acm.org/doi/10.17487/RFC2198, Sep. 1997, 11 pages.

Valin, J.M., et al., "A Real-Time Wideband Neural Vocoder at 1.6 kb/s Using LPCNet," Proc. Interspeech 2019, https://arxiv.org/abs/1903.12087, Jun. 2019, pp. 3406-3410.

Jiang, X., et al., "End-To-End Neural Speech Coding for Real-Time Communications," 2022 IEEE International Conference on Acoustics, Speech and Signal Processing (ICASSP), https://ieeexplore.ieee.org/document/9746296, Feb. 15, 2022, pp. 866-870.

Schulzrinne, H., et al., "RTP: A Transport Protocol for Real-Time Applications," RFC 3550, https://www.rfc-editor.org/rfc/rfc3550, Jul. 2003, 104 pages.

Panayotov, V., et al., "Librispeech: An ASR corpus based on public domain audio books," 2015 IEEE International Conference on Acoustics, Speech and Signal Processing (ICASSP), https://ieeexplore.ieee.org/document/7178964, Apr. 2015, pp. 5206-5210.

Diener, L., et al., "Interspeech 2022 Audio Deep Packet Loss Concealment Challenge," https://arxiv.org/abs/2204.05222, Apr. 11, 2022, 5 pages.

Diener, L., et al., "PLCMOS—a data-driven non-intrusive metric for the evaluation of packet loss concealment algorithms," https://arxiv.org/abs/2305.15127, May 24, 2023, 5 pages.

Gray, R., "Vector quantization," https://ieeexplore.ieee.org/document/1162229, IEEE ASSP Magazine, Apr. 1984, 26 pages.

Vasuki, A., et al., "A review of vector quantization techniques," https://ieeexplore-dev.ieee.org/document/1664069, IEEE Potentials, Jul. 2006, 9 pages.

Lin, J., et al., "A Time-Domain Convolutional Recurrent Network for Packet Loss Concealment," https://ieeexplore.ieee.org/document/9413595, ICASSP, Jun. 2021, 5 pages.

Zeghidour N., et al., "SoundStream: An End-to-End Neural Audio Codec", IEEE/ACM Transactions on Audio, Speech, and Language Processing, vol. 30, 2022, Published on Nov. 23, 2021, pp. 495-507.

* cited by examiner

# REDUCED MULTIDIMENSIONAL INDICES COMPRESSION FOR AUDIO CODEC SYSTEM

PRIORITY CLAIM

This application claims priority to U.S. Provisional Application No. 63/591,247, filed Oct. 18, 2023, which is incorporated herein by reference in its entirety.

TECHNICAL FIELD

The present disclosure relates generally to improving indices compression after vector quantization in an audio codec system.

BACKGROUND

An audio encoder encodes input audio into vectors. Next, a vector quantizer quantizes the vectors into indices of codevectors stored in a codebook for transmission to an audio decoder. Prior to transmission, the indices from the vector quantizer can be compressed with entropy coding, such as Huffman coding. The compression efficiency can be improved by generating databases of statistics for longer and longer sequences of indices; however, the amount of data needed to generate these databases, and the complexity of these databases, exponentially increase with the length of the sequences.

DETAILED DESCRIPTION

Overview

In an encoder embodiment, a method comprises: storing n dimension (nD) dictionaries (nD dictionaries) where n decreases from a highest dimension to a lowest dimension, each nD dictionary including codewords for sequences of n symbols that are of a limited number that is less than all possible sequences of n symbols; storing key blocks for corresponding ones of the nD dictionaries, each key block configured with keys that map sequences of n−1 symbols to dictionaries of a corresponding one of the nD dictionaries that includes the codewords; receiving a sequence of symbols that represent indices of codevectors of a vector quantizer codebook that are representative of audio; determining a codeword using the key blocks and the nD dictionaries; and encoding a current symbol of the sequence of symbols using the codeword.

In a decoder embodiment, a method comprises: storing n dimension (nD) dictionaries (nD dictionaries) where n decreases from a highest dimension to a lowest dimension, each nD dictionary including symbols for sequences of n codewords that are of a limited number that is less than all possible sequences of n codewords; storing key blocks for corresponding ones of the nD dictionaries, each key block configured with keys that map sequences of n−1 codewords to dictionaries of a corresponding one of the nD dictionaries that includes the symbols; receiving a sequence of codewords that represent encoded symbols that are encoded indices of codevectors of a vector quantizer codebook that are representative of audio; determining a symbol using the key blocks and the nD dictionaries; and decoding a current codeword in the sequence of codewords using the symbol.

Example Embodiments

Neural Audio Codec System

Figure 1:
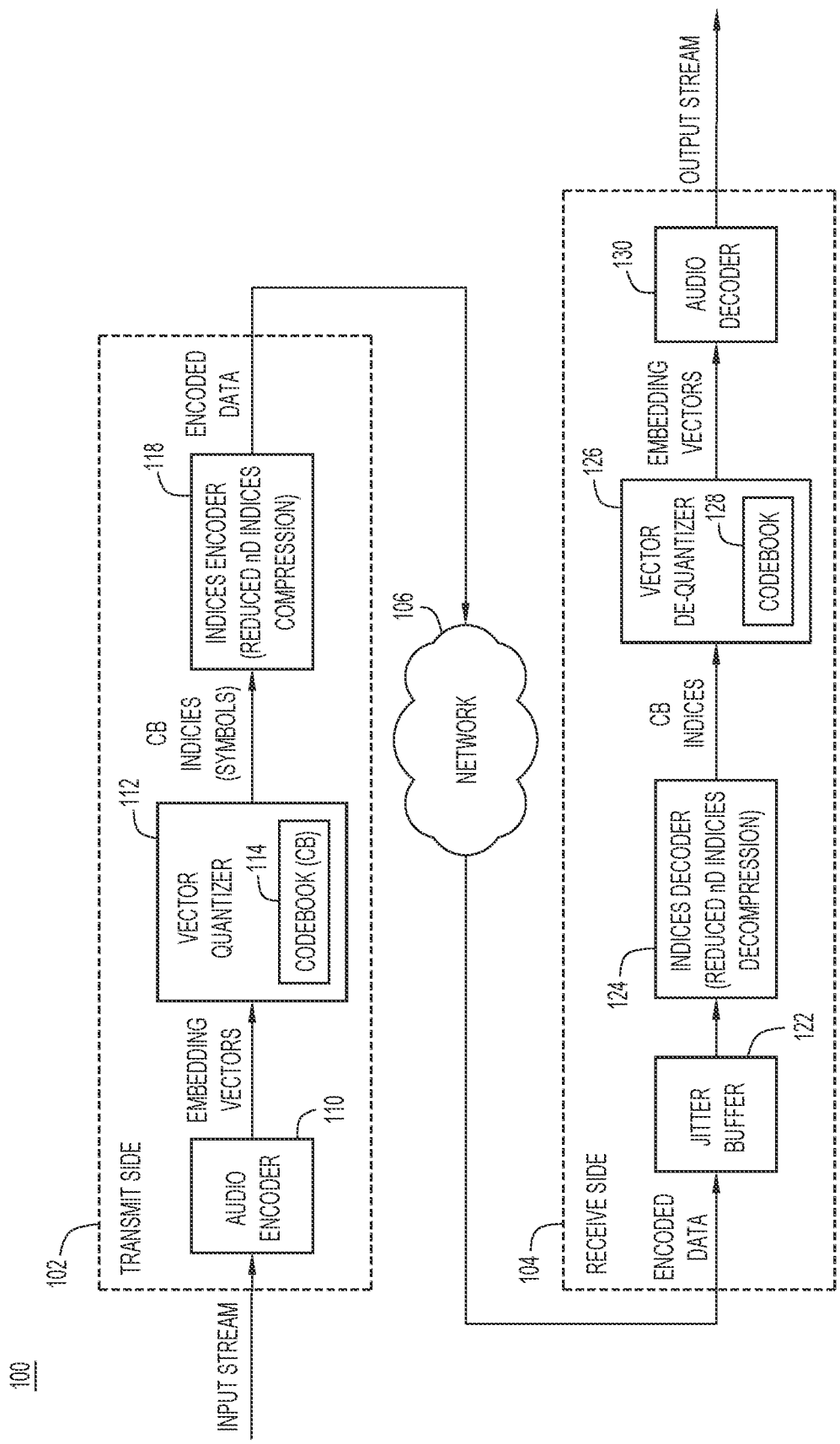
FIG. 1 shows a block diagram of a neural audio encoder/decoder (codec) system that is trained to perform audio processing, according to an example embodiment.

FIG. 1 is a block diagram of a neural audio encoder/decoder (codec) system 100 configured to perform audio processing described herein. The term "neural" is used to indicate that the system may be trained using neural networks (machine learning) techniques. A method of training neural audio codec system 100 is described below in connection with FIG. 2. Neural audio codec system 100 includes a transmit side 102 and a receive side 104, which may be separate at devices that are in communication with each other via network 106. Network 106 may be a combination of (wired or wireless) local area networks, (wired or wireless) wide area networks, public switched telephone network (PSTN), etc.

Transmit side 102 includes an audio encoder 110, a vector quantizer 112 that employs a codebook 114, and an indices encoder 118 that operates according to embodiments presented herein. During inference stage operation (i.e., post training), audio encoder 110 receives an input audio stream (that includes speech as well as artifacts and impairments). Audio encoder 110 may use a deep neural network (DNN) that takes the input audio stream and transforms it, frame-by-frame, into high-dimensional embedding vectors that retain all the important information, and optionally removes unwanted information such as the artifacts and impairments. The audio encoder 110 may be composed of convolutional, recurrent, attentional, pooling, or fully connected neural layers as well as any suitable nonlinearities and normalizations. In one example, the audio encoder 110 uses a causal convolutional network with zero algorithm latency. The convolutional network may consist of convolutional blocks, and each convolutional block may be a stack of multiple residual units (1D convolutional layer with residual connection) and finishes with a 1D convolutional layer with stride for down-sampling. The embedding vectors are representative of the input audio stream. The duration of the frames may be 10-20 millisecond (ms), for example.

Vector quantizer 112 uses codebook 114 to quantize the embedding vectors. Codebook 114 includes codewords associated with/referenced by indices to access the codewords. Vector quantizer 112 quantizes the embedding vectors into codewords from the codebook that most closely match the embedding vectors, to produce indices that represent the codewords. For example, vector quantizer 112 may use techniques such as Residual Vector Quantization to select the codewords from codebook 114 from each layer to optimize a criterion reducing quantization error. Thus, vector quantization is further compressing the embedding vectors into codewords, using a residual vector quantization model. The output of the vector quantization operation may also be referred to as compact or compressed speech vectors or compact speech tokens. The indices of the selected codewords for each frame are put into transmit (TX) packets and sent to the receive side 104, or they may be stored for later retrieval and use. In some implementations, audio encoder 110 may generate the quantized vectors (indices) directly without the need for a separate vector quantizer.

According to embodiments presented herein, indices encoder 118 employs the reduced multidimensional indices compression to compress the indices into compressed indices (referred to more generally as "encoded data") comprising a series of bits. The reduced multidimensional indices compression represents a technique that significantly reduces the complexity of traditional compression. Embodiments directed to the reduced multidimensional indices compression and reduced multidimensional decompression are described below in connection with FIGS. 3-6B. Indices encoder 118 populates transmit (TX) packets with the encoded data (i.e., the compressed indices), and transmits the TX packets to receive side 104 through network 106 and/or stores the TX packets for later retrieval and use. Indices encoder 118, for example.

Receive side 104 includes a jitter buffer 122, an indices decoder 124, a vector de-quantizer 126 that employs a codebook 128, and an audio decoder 130. Receive side 104 obtains receive (RX) packets from network 106. Jitter buffer 122 tracks and orders the incoming packets, and determines when to process and play each packet. Jitter buffer 122 may also be used to detect packet losses. According to embodiments presented herein, indices decoder 124 employs reduced multidimensional indices decompression (which is the reverse process of the reduced multidimensional indices compression) to recover indices from the RX packets. That is, indices decoder 124 decompresses the compressed indices to produce the indices, and provides the indices to vector de-quantizer 126. Vector de-quantizer 126 uses codebook 128 (which includes a copy of codebook 114) to de-quantizes the indices to produce recovered embedding vectors. Audio decoder 130 decodes the embedding vectors to produce an output audio stream that replicates the input audio stream.

Techniques are provided for a generative artificial intelligence (AI) architecture built on the neural audio codec system 100 shown in FIG. 1. At the core of this architecture is a compact speech vector that has great potential for a wide range of speech AI and other applications. The proposed unified architecture offers a versatile solution applicable to various content, including, but not limited to, speech enhancement (such as background noise removal, de-reverberation, speech super-resolution. bandwidth extension, gain control, and beamforming), packet loss concealment (with or without forward error correction (FEC)), acoustic speech recognition (ASR), speech synthesis, also referred to as text-to-speech (TTS), voice cloning and morphing, speech-to-speech translation (S2ST), and audio-driven large language model (AdLLM).

Neural Audio Codec Training

Figure 2:
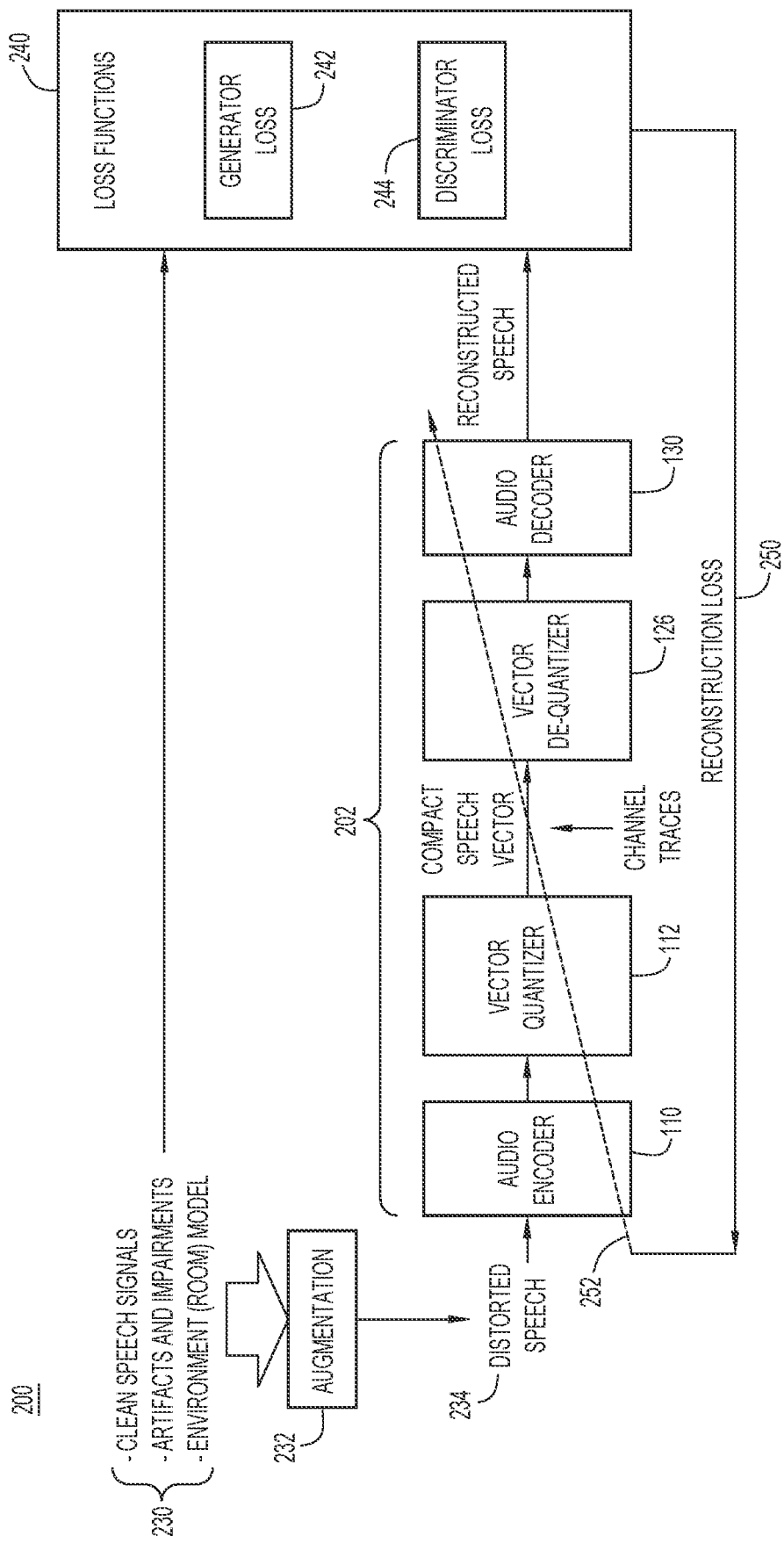
FIG. 2 shows an arrangement by which various components of the neural audio codec system are trained end-to-end using a corpus of speech and artifacts and impairments, according to an example embodiment.

FIG. 2 shows an arrangement 200 by which various components of neural audio codec system 100 are trained end-to-end using thousands of hours of speech and artifacts and impairments. Arrangement 200 includes audio encoder 110, vector quantizer 112 (which uses codebook 114, not shown), vector de-quantizer 126 (which uses codebook 128, not shown), and audio decoder 130 (collectively indicated by reference numeral 202), which may all use neural network models (or more generally machine learning-based models) for their operations. Thus, the training techniques described in connection with FIG. 2 train the neural network models of these components. Indices encoder 118 and indices decoder 124 may be included in the training arrangement, or may be omitted in the training arrangement.

To train the neural audio codec system 100, as shown at reference numeral 230, various artifacts and impairments are applied to the clean speech signals through an augmentation operation 232 to produce distorted speech 234. The artifacts and impairments may include background noise, reverberation, band limitation, packet loss, etc. In addition, an environment model, such as a room model, may be used to impact the clean speech signals. The distorted speech 234 is then input into the neural audio codec system 100 in its initially untrained state.

The training process involves applying loss functions 240 to the reconstructed speech that is output by audio decoder 130. Loss functions 240 may include a generative loss function 242 and an adversarial/discriminator loss function 244. Loss functions 240 output a reconstruction 250 that is used to adjust parameters of the neural network models used by audio encoder 110, vector quantizer 112, vector de-quantizer 126 and audio decoder 130, as shown at 252. Thus, the neural network models used by audio encoder 110, vector quantizer 112 and its codebook, vector de-quantizer 126 and its codebook, and audio decoder 130 may be trained in an end-to-end hybrid manner using a mix of reconstruction and adversarial losses.

As a result of this training, audio encoder 110 takes raw audio input and leverages a deep neural network to extract a comprehensive set of features that encapsulate intricate speech and background noise characteristics jointly or separately. The extracted speech features represent both the speech semantic as well as speech stationary attributes such as volume, pitch modulation, accent nuances, and more. This represents a departure from conventional audio codecs that rely on manually designed features. In the embodiments presented herein, the neural audio codec systems learns and refines its feature extraction process from extensive and diverse datasets, resulting in a more versatile and generalized representation.

The output of audio encoder 110 materializes as a sequence of embedding vectors, with each embedding vector encapsulating a snapshot of audio attributes over a timeframe. Vector quantizer 112 further compresses the embedding vectors into compact/quantized speech vectors, i.e., codevectors, using a residual vector quantization model. The codevector indices streams are ready for transmission or storage. At the receiving end, the audio decoder takes the compressed bitstream as input, reverses the quantization process, reconstructs the speech into time-domain waveforms.

The end-to-end training may result in a comprehensive and compact representation of clean speech. This is a data-driven compressed representation of speech, where the representation has a lower dimensionality that makes it easier to manipulate and utilize than if the speech were in its native domain. By "data-driven" it is meant that the representation of speech is developed or derived through ML-based training using real speech data, rather than a human conjuring the attributes for the representation. The data used to train the models may include a wide variety of samples of speech, languages, accents, different speakers, etc.

In the use case of speech enhancement, the compact speech vector represents "everything" needed to recover speech but discarding anything else related to artifacts or impairments. Thus, for speech enhancement applications, the neural audio codec system does not encode audio, but rather, encodes only speech, discarding the non-speech elements. In so doing, the neural audio codec system can achieve a more uniquely speech-related encoding, and that encoding is more compact because it does not express the other aspects that are included in the input audio. Training to encode speech is effectively training to reject everything else, and this can result in a stronger speech encoded foundation for any other transformation to or from speech.

Loss Functions for Training

Loss functions useful during training are now described. Reconstruction losses may be used to minimize the error between the clean signal, known as a target signal, x and an enhanced signal generated by the neural audio codec, denoted $\hat{x}$, which is denoised and dereverberated and/or with concealed packets/frames loss of its input signal y, noisy, reverberated audio signal and/or with lost packets/frames. One or more reconstruction losses may be used in the time domain or time-frequency domain.

A loss in the time domain may involve minimizing a distance between estimated clean $\hat{x}$ and the target signal x in the time domain:

$$\mathcal{L}_t = \sum_{n=1}^{N} |x[n] - \hat{x}[n]|,$$

where $\mathcal{L}_t$ is the L1 norm loss and N denotes to number of samples of $\hat{x}$ and x in the time domain, where L1 Norm is a sum of the magnitudes of the vectors in a space and is one way to measure distance between vectors (sum of absolute difference of components of the vectors). In some implementations, the L1 norm loss and/or the L2 norm loss may be used.

A weighted signal-to-distortion radio (weighted SDR) may be used, where the input signal y is represented as x with additive noise n: y=x+n, then SDR loss is defined as:

$$\mathcal{L}_{SDR}(x, \hat{x}) = -\frac{\langle x, \hat{x} \rangle}{\|x\|\|\hat{x}\|},$$

where the operator $\langle . \rangle$ represents the inner product and $\|.\|$ represents Euclidean norm. This loss is phase sensitive with the range [−1,1]. For noise only samples, to be more precise, a noise prediction term is added to define the final weighted SDR loss:

$$\mathcal{L}_{SDR}(x,n,\hat{n}) = \mathcal{L}_{SDR}(x,\hat{x}) + \mathcal{L}_{SDR}(n,\hat{n}),$$

where $\hat{n}=y-\hat{x}$ is estimated noise.

Multi-scale Short-Time Fourier Transform (MS-STFT) operates in the frequency domain using different window lengths. This approach of using various window lengths is inspired by the Heisenberg Uncertainty Principle, which shows that a larger window length gives greater frequency resolution but lower time resolution, and the opposite for a shorter window length. Therefore, the MS-STFT uses a range of window lengths to capture different features of the audio waveform.

The loss is defined as:

$$\mathcal{L}_{MSTFT} = \sum_{l=1}^{L} \sum_{k=1}^{K} \left|S^w[l,k] - \hat{S}^w[l,k]\right| + \alpha_w \sum_{l=1}^{L} \sum_{k=1}^{K} \sqrt{|\log(S^w[l,k]) - \log(\hat{S}^w[l,k])|^2},$$

where $S^w[l,k]$ is the energy of the spectrogram at frame l and frequency bin k and characterized by a window w, K is the number of frequency bins, L is the number of frames and $\alpha_w$ is a parameter to balance between L1 Norm and L2 Norm part of the loss, where the L2 Norm is the square root of the sum of the entries of a vector. The second part of the loss is computed using a log operator to compress the values. Generally, most of the energy content of speech signal is concentrated below 4 kHz. Therefore, the energy magnitude in lower frequency components is significantly higher than higher frequency components, with going to log domain, the magnitude of higher frequencies and lower frequencies get closer, thus more focus on higher frequency components compared to linear scale. A high-pass filter can be designed to improve performance for high-frequency content.

A Mean Power Spectrum (MPS) loss function aims to minimize the discrepancy between the mean power spectra of enhanced and clean audio signals in the logarithmic domain using L2 Norm.

The power spectrum of the signal is computed as below:

$$P(x) = 1/N \sum_{n=0}^{N-1} |X_n|^2,$$

where P(x) is the mean power spectrum of signal x, X is FFT/STFT of signal x.

A logarithm may be applied to the mean power spectrum, such that the logarithmic power spectrum of a signal x is:

$$L(x)=10 \log_{10}(P(x)+\epsilon),$$

where $\epsilon$ is a small constant to prevent the logarithm of zero.

The MPS loss between the enhanced and clean signals can then be defined as the L2 Norm of the difference between their logarithmic power spectra:

$$\mathcal{L}_{oss}(\hat{x},x) = \sqrt{\Sigma(L(\hat{x})-L(x))^2}.$$

Generative Adversarial Networks (GANs) comprise two main models: generator and discriminator. In the neural network codec system, the audio encoder, vector quantizer and audio decoder may employ GAN generator and discriminator models. As an example, two adversarial loss functions could be used in the neural audio codec system: Lease-squared adversarial loss functions and hinge loss functions.

Least square (LS) loss functions for discriminator and generator may be respectively defined as:

$$\mathcal{L}_{ADV}(D;G)=E_{(x,s)}[(D(x)-1)^2+D(G(y))^2],$$

$$\mathcal{L}_{ADV}(G;D)=E_d[D(G(y))-1)^2].$$

For discriminator loss, $\mathcal{L}_{ADV}(D; G)$, $E_{(.)}$ is the expectation operator, $D(x)$, is the output of the discriminator for a real signal x, $D(G(y))$ is the discriminator output of enhanced (fake) signal and $\mathcal{L}_{ADV}(G; D)$ is the generator loss.

Hinge loss for the discriminator and generator may be defined as:

$$\mathcal{L}_{ADV}(D;G)=E_{(x,y)}[\max(1-D(x),0)+\max(0,1+D(G(y)))],$$

$$\mathcal{L}_{ADV}(G;D)=E_y[\max(1-D(G(y)),0)].$$

Hinge loss may be preferred over least square loss because in the case of discriminator loss, hinge loss tries to maximize the distance between the real signal and fake signal while LS loss tries to score 1 when the input is a "real signal" and 0 when the input is "fake signal".

In addition to above-mentioned losses, feature matching may be used to minimize the difference between the intermediate features of each layer of real and generated signals when passed through the discriminator. Instead of solely relying on the final output of the discriminator, feature matching ensures that the generated samples have similar feature statistics to real samples at various levels of abstraction. This helps in stabilizing the training process of adversarial networks by providing smoother gradients. Feature matching loss may be defined as:

$$\mathcal{L}_{FM}(G;D) = E_{(x,y)}\left[\sum_{i=1}^{T}\frac{1}{N_i}\|D^i(x)-D^i(G(y))\|_1\right],$$

where $N_i$ is the number of layers in the discriminator D, and superscript i is used to design the layer number. Note that feature matching loss updates only generator parameters.

Several different discriminator models may be suitable for use in the training arrangement of FIG. 2, including: Multi-Scale Discriminator (MSD), Multi-Period Discriminator (MPD) and Multi-Scale Short-Time Fourier Transform (MS-STFT).

For a MSD, the discriminator is looking at the waveform at the different sampling rates. The waveform discriminators have the same network architecture but use different weights. Each network is composed of n number of strided 1-dimensional (1D) convolution blocks, an additional 1D convolution, and global average pooling to output a real-value score. A "leaky" rectifier linear unit (Leaky ReLu) may be used between the layers for the purpose of non-linearity of the network.

A MPD operates on the time-domain waveform and tries to capture implicit periodicity structure of the waveform. In an MPD discriminator, different periods of the waveform are considered. For each period, the same network architecture, with different weights, are used. The network consists of n strided two-dimensional (2D) convolution blocks, an additional convolution, and a global average pooling for outputting a scalar score. In the convolution block weight normalization may be used along with a Leaky ReLu as an activation function.

An MS-STFT discriminator, unlike the MSD and MPD, operates in the frequency domain using a Short-Time Fourier Transform (STFT). This discriminator enables the model to analyse the spectral content of the signal. The MS-STFT discriminator analyzes the "realness" of the signal at multiple time-frequency scales or resolutions. Having spectral content of the waveform in various resolutions, the model is able to analyze the "realness" of the waveform more profoundly. The MS-STFT discriminator may be composed of t equivalent networks that handle multi-scaled complex-valued STFTs with incremental window lengths and corresponding hop sizes. Each of these networks contains a 2D convolutional layer, with weight normalization applied, featuring a n×m kernel size and c number of channels, followed by a Leaky ReLu non-linear activation function. Subsequent 2D convolution layers have dilation rates in the temporal dimension and an output stride of j across the frequency axis. At the end we have d×d convolution with stride 1 followed by flatten layer to get the output scores.

Finally, the total loss of adversarial training may be defined as:

$$\mathcal{L}=\lambda_{FM}\mathcal{L}_{FM}+\lambda_{MSTFT}\mathcal{L}_{MSTFT}+\lambda_G\mathcal{L}_{ADV}(G;D)+\lambda_D\mathcal{L}_{ADV}(D;G)+\lambda_t\mathcal{L}_t+\lambda_{SDR}\mathcal{L}_{SDR},$$

where λ coefficients are used to give more weights to some losses compared to the other losses, $\mathcal{L}_{FM}$ is the feature matching loss. $\mathcal{L}_{MSTFT}$ is MS-STFT loss that can be replaced by $\mathcal{L}_{MSD}$ for MSD discriminator or $\mathcal{L}_{MPD}$ for MPD discriminator.

Reduced Multidimensional Indices Compression and Decompression

In the ensuing description, "symbol" and "symbols" are synonymous with and often used in place of "index" and "indices." In other words, the "indices" generated by vector quantizer 112 and provided to indices encoder 118 are referred to as "symbols." Higher dimensional entropy coding improves compression ratios by reducing entropy of encoded symbols based on longer and longer sequences of past symbols. This in turns leads to exponentially higher complexity. The reduced multidimensional indices compression manages the higher complexity by trading complexity for compression.

As described above, audio encoder 110 and vector quantizer 112 are trained during the data driven training described above. Post training, at every fixed time interval, audio encoder 110 encodes an input audio stream into a sequence of embedding vectors. In turn, vector quantizer 112 quantizes the sequence of embedding vectors into a sequence of symbols (referred to above as "indices") of codevectors of codebook 114 to be transmitted to receive side 104. For example, vector quantizer 112 assigns the embedding vectors to symbol clusters based on a distance computation to centroids of the clusters. The distance computation may be based on a negative dot product, for example.

Indices encoder 118 employs the reduced multidimensional indices compression to compress the symbols. The reduced multidimensional indices compression improves a compression rate of the symbols compared to conventional multidimensional indices compression. The reduced multidimensional indices compression employs multidimensional (nD) dictionaries, indexed by keys, to hold dictionary codewords (referred to simply as "codewords" in the ensuing description) used to compress/encode symbols. Compared to conventional multidimensional indices compression, the reduced multidimensional indices compression uses substantially reduced numbers of dictionaries, codewords, and keys.

The reduced multidimensional indices compression uses only a subset of all possible dictionaries indexed by the most frequent or most likely dictionary keys. At a high-level, to encode a symbol (i.e., indices) sequence, the reduced multidimensional indices compression initially searches for a key (that matches the symbol sequence) in a highest dimension (and most encoding efficient) key/dictionary space. When the key is not found, the reduced multidimensional indices compression searches for the key in successively lower dimension key/dictionary spaces, until the key is found. The lowest dimension (should it be reached) guarantees that the key will always be found. Once the key is found, the reduced multidimensional indices compression uses the key to access, from a dictionary, a codeword to encode the current symbol.

The reduced multidimensional indices compression is now described in detail with comparison to conventional techniques. By way of example, assume codebook 114 of vector quantizer 112 stores N=1024 codevectors represented by 1024 symbols (i.e., indices) from {0, 1, . . . , 1023}, each represented as a 10-bit word. Then vector quantizer 112 produces a sequence of symbols that can each take on a value, e.g., from {0, 1, . . . , 1023}. This is referred to as a "symbol sequence." Consider a symbol sequence generated by vector quantizer 112 that has four symbols {1, 10, 255, 1023} from the set of 1024 possible symbols {0, 1, . . . , 1023}. A conventional approach, which does not consider a prior probability distributions of the symbols or symbol sequences, encodes each symbol into a codeword. For example, the conventional approach assigns each symbol to a 10-bit fixed length codeword, as shown in Table 1, for example.

TABLE 1

| Symbol | Fixed Length Codeword |
| --- | --- |
| 1 | 0000000001 |
| 10 | 0000001010 |
| 255 | 0111111111 |
| 1023 | 1111111111 |

Table 1 shows a portion of a conventional table or dictionary that assigns symbols to fixed length codewords for purposes of encoding. Encoding the sequence of symbols {1, 10, 255, 1023} based on Table 1 produces a 40-bit sequence {0000000000 0000001010 0011111111 1111111111} having an average compression rate of 10-bits per symbol.

In contrast to the conventional approach, dictionaries employed by the reduced multidimensional indices compression (i.e., by indices encoder 118) utilize variable-length codewords generated based on probability distributions of all symbols or sequences of symbols (i.e., "symbol sequences"). This approach assigns more frequent (i.e., more likely) symbols/sequences of symbols to shorter codewords from a dictionary. A one-dimensional (1D) dictionary is created to encode single symbols. The acronym "D" as used herein may refer to "dimensional" or "dimension" depending on context. The 1D dictionary maps all possible single symbols to corresponding variable length codewords. For example, the 1D dictionary may include 1024 codewords (i.e., entries/fields) that are each a variable length codeword, as shown in Table 2.

TABLE 2

| Symbol | Probability | Variable Length Codeword |
| --- | --- | --- |
| 1 | 0.5 | 01 |
| 10 | 0.001 | 00000000101 |
| 255 | 0.12 | 110001 |
| 1023 | 0.09 | 00000111 |

Table 2 shows an example 1D dictionary that assigns symbols to variable length codewords based on frequencies of the symbols. The more frequent the symbol, the shorter the codeword that is assigned to the symbol, and vice versa. Encoding the sequence of symbols {1, 10, 255, 1023} based on the 1D dictionary of Table 2 produces a 35-bit sequence {0000000001 00000000101 00000111} with an average compression rate of 8.75-bits per symbol.

While the 1D dictionary encodes a single symbol, a 2D dictionary encodes a pair of symbols (i.e., a symbol pair). In this case, the 2D dictionary is created for all possible symbol pairs. Each symbol pair includes a previous symbol and a current symbol. When each symbol has 1024 possibilities, the 2D dictionary accounts for a total 1024×1024 ($N^2$) symbol pair combinations. In this case, a separate dictionary may be defined for each of the previous symbols—thus 1024 dictionaries, and each dictionary has 1024 fields (i.e., codewords). To know which of the 1024 dictionaries to choose from, a key is used. The key serves as an index or pointer to one of the 1024 dictionaries. In 2D, the previous symbol plays the role of the key. Then, the current symbol finds a codeword in the dictionary, such that the higher the transition probability to the current symbol, the shorter the codeword.

Figure 3:
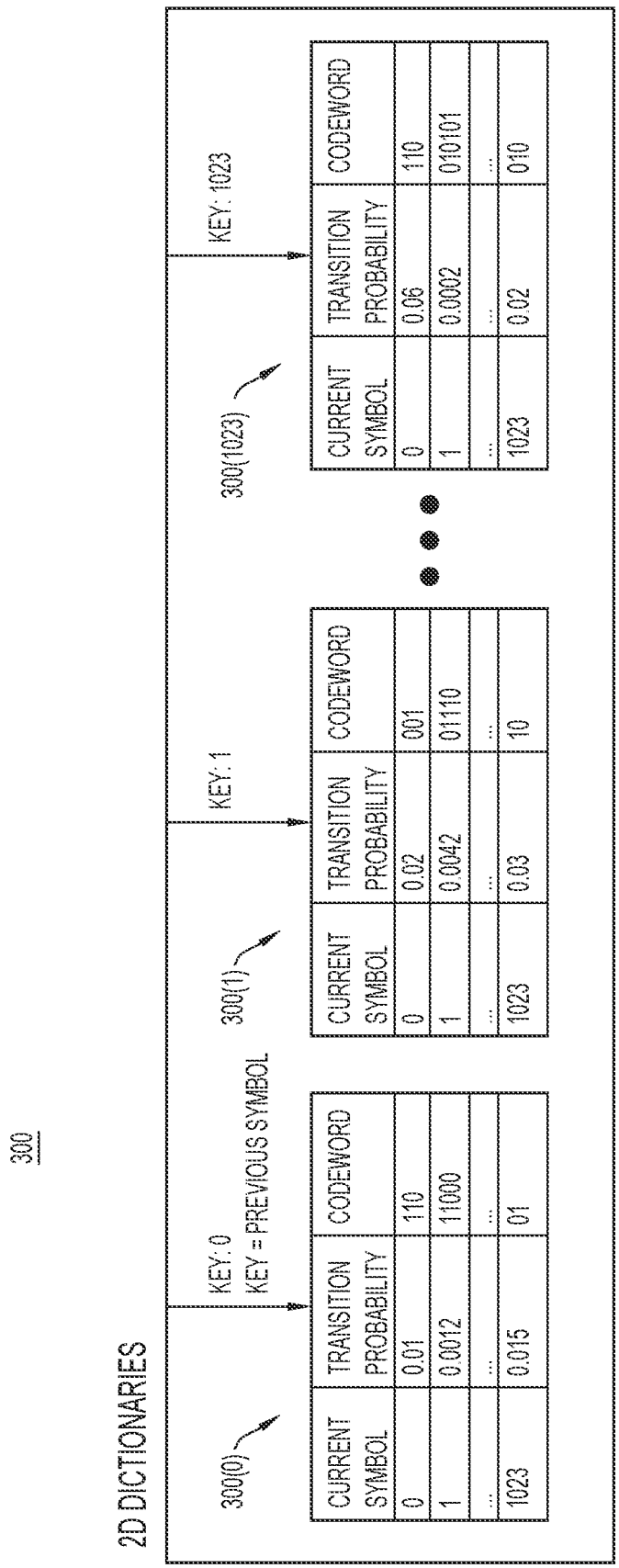
FIG. 3 shows an example two-dimensional (2D) dictionary employed by an indices encoder of the neural audio codec system to encode a symbol pair using reduced multidimensional indices compression, according to an example embodiment.

FIG. 3 shows an example 2D dictionary 300 that may be used to encode a symbol pair including a previous symbol and a current symbol. 2D dictionary 300 includes 1024 dictionaries 300(0), 300(1), . . . , 300(1023) and keys 0, 1, . . . , 1023 that index corresponding ones of the dictionaries, as shown. Each dictionary 300($i$) includes rows corresponding to possible current symbols 0, 1, . . . , 1023. Each row maps a current symbol to a codeword used to encode the current symbol and a transition probability from a previous symbol (the key) to the current symbol. Given a symbol pair to be encoded, a previous symbol serves as the key that indexes one of the dictionaries, and the current symbol indexes a codeword in that dictionary.

Extending the 2D dictionary to 3D, the first two symbols of a symbol triplet serve as keys to dictionaries of the 3D dictionary. The symbol triplet creates $1024^2$ dictionaries, each with 1024 fields for $1024^3$ combinations of symbol triplets. Consider a symbol triplet {1, 10, 255}, then the key is created for the previous pair {1, 10}, which indexes one of the $1024^2$ 3D dictionaries, and the current symbol {255}, which indexes the codeword in that dictionary.

Table 3 below presents how keys for different dimensions are obtained/computed for an example sequence of symbols using a key function (described below). In Table 3, each current symbol to be encoded is bolded, and the previous symbol/symbols used to assemble the dictionary keys are not bolded.

TABLE 3

| Dictionary | Sequence of symbols | Key to the dictionary |
| --- | --- | --- |
| 1D | {1} | None |
| 2D | {1, 10} | 1 |
| 3D | {1, 10, 255} | 1024 * 1 + 10 = 1034 |

TABLE 3-continued

| Dictionary | Sequence of symbols | Key to the dictionary |
|---|---|---|
| 4D | {1, 10, 255, 1023} | $1024^2 * 1 + 1024 * 10 + 255 = 1059071$ |

In general, for a sequence of symbols (i.e., a symbol sequence) defined as S[t], where t denotes an index of a sequence (t=1, . . . , M), an example n-dimensional key formula, where S∈[0, 1023], may be described by the following:

$$\text{Key } nD = (1024^{n-2} * S[t-n+1] + 1024^{n-3} * S[t-n+2] + \ldots + 1024 * S[t-2] + S[t-1]) \quad \text{eq. (1)},$$

where n can take values of 2 . . . N.

Given a symbol sequence to be encoded that includes previous symbols preceding a current symbol, the reduced multidimensional indices compression maps the previous symbols of the symbol sequence to a number/value using the key function, and uses that number/value as a key to a dictionary. Using the key as an index can be less complex than using the raw previous symbols as the index, especially as a length of the symbol sequence increases. As will be described below, predefined keys used to create predefined multi-dimensional dictionaries are the same as those used when actually encoding a symbol sequence.

In general, a real-time encoding process for an n symbol sequence (i.e., a symbol sequence of length/dimension n, in which each symbol can take on N values) that includes n−1 previous symbols and a current symbol, using predefined nD dictionaries and corresponding keys, is as follows: (i) using the n−1 previous symbols, find a key that maps the n−1 previous symbols to one of $N^{n-1}$ (e.g., when N=1024, $1024^{n-1}$) dictionaries of the nD dictionary, (ii) when the key is found, use the current symbol to find an entry/codeword in the one of the dictionaries indexed by the key, and (iii) encode the current symbol using the codeword from the dictionary. When the key is not found, repeat the process in the next lower dimension using an incrementally shortened symbol sequence.

The real-time encoding process relies on the predefined nD dictionary and keys. Accordingly, an a priori/precompute process is used to construct or assemble the predefined dictionaries and their keys, before performing the real-time encoding. An example precompute process may include the following operations:

a. Run/process a large amount of audio data (e.g., over 1000 hours of audio) through audio encoder 110 and vector quantizer 112 to produce a long sequence of symbols. In this example, each symbol may take on any of N=1024 values.

b. Using the sequence of symbols, create histograms used to generate nD dictionaries from n=1 to n=N. In the 1D case, generate a histogram that contains a frequency of each individual symbol. In the 2D case, for each previous symbol, generate a histogram of frequencies for the current symbol. In the 3D case, for each pair of previous symbols, generate a histogram of frequencies for the current symbol, and so on for successively higher dimensions.

c. Normalize the histograms to obtain a probability distribution.

d. Format keys based on a previous symbol/previous symbols. That is, compute keys for the symbol sequences obtained from (a) using a key function, e.g., using eq. (1). For example, for symbol sequence 1, 10, 255, compute key=1034, and so on, using eq. (1). This produces keys for all symbol sequences of all different lengths (i.e., dimensions).

e. Select a limited number of the most frequent keys (as computed at (d)) in each dimension. The limited number is substantially less than a total number of possible keys for each dimension, e.g., select the top 1% of most frequent keys. Operation (e) selects a first limited set of most frequent keys for the 2D dictionary, a second limited set of most frequent keys for the 3D dictionary, and so on.

f. Use an entropy coding technique to obtain dictionaries that store variable length codewords for the most frequent keys based on the probability distribution from (c). This produces a limited number of dictionaries in each dimension equal to the limited number of keys for each dimension. The dictionaries and their keys represent the predefined dictionaries used by indices encoder 118 to encode symbol sequences in real-time.

Figure 4:
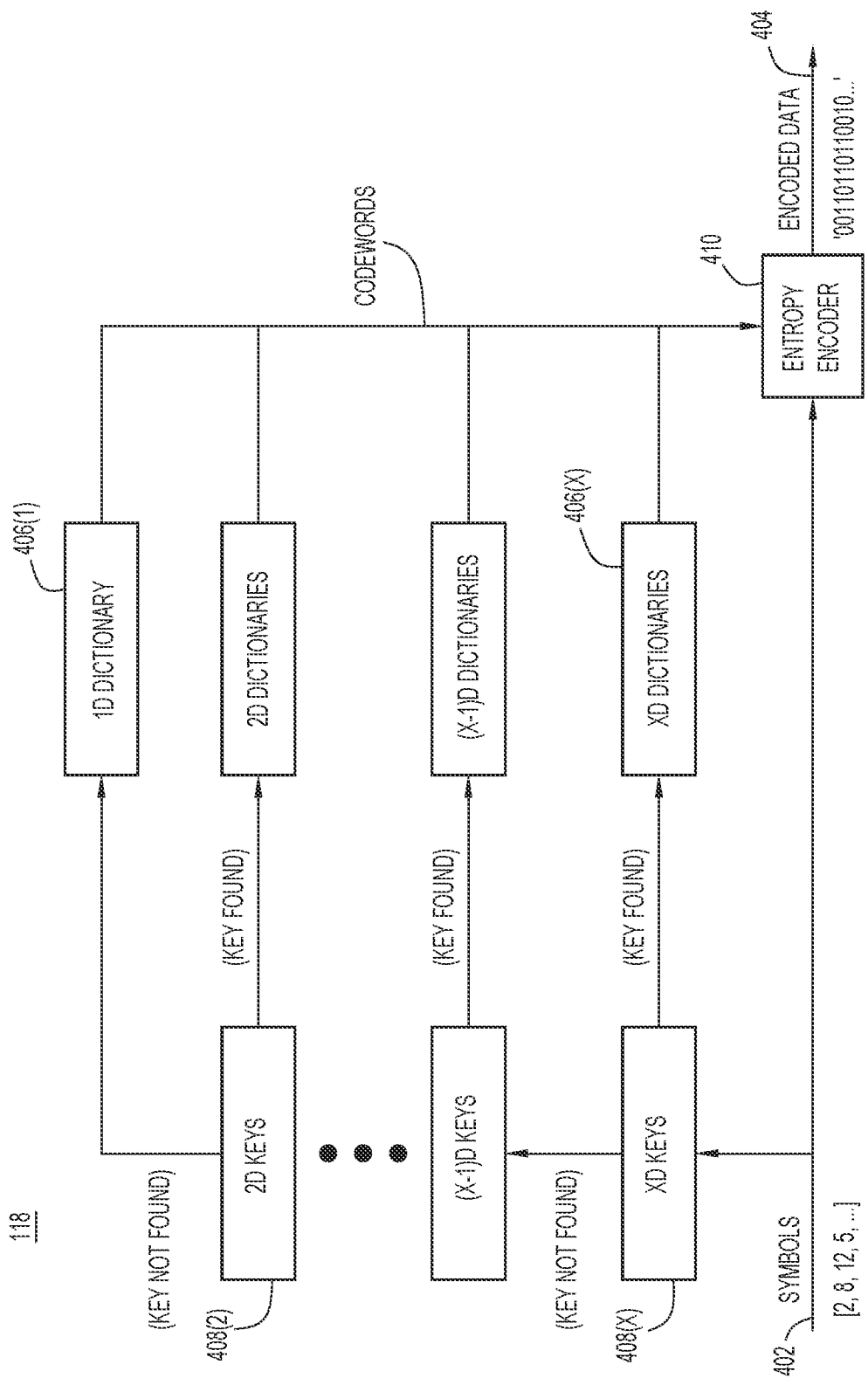
FIG. 4 is a block diagram of indices encoder configured to perform the reduced multidimensional indices compression, according to an example embodiment.

FIG. 4 is a block diagram of indices encoder 118 configured to perform the reduced multidimensional compression according to an embodiment. Indices encoder 118 employs predefined dictionaries and keys to encode a symbol sequence 402 into encoded data 404. More specifically, indices encoder 118 includes/stores dictionaries 406(1)-406(X) (also referred to generally as "nD dictionaries," where n=1 to X), and key blocks 408(2)-408(X) (also referred to generally as "nD keys" where n=2 to X) for dictionaries 406(2)-406(X). Indices encoder 118 also includes an entropy encoder 410. In some examples, X may be small, e.g., 3, 4, 5, and so on, although higher numbers are possible.

For n=2 to n=X, each set of nD keys includes only a limited number of most frequent keys of all possible keys to map a limited number of most frequent n−1 previous symbol sequences (of all possible n−1 symbol sequences) to a correspondingly limited number of most frequently used dictionaries of a corresponding one of the nD dictionaries. That is, each dimension n has a predefined set of the most frequent keys, whose number is significantly smaller than if all possible keys were to be included. The 2D keys map 1 previous symbol of a 2 symbol sequence to the 2D dictionaries, the 3D keys maps a limited number of 2 previous symbols of a 3 symbol sequence to the 3D dictionaries, and so on.

The limit on the number of keys in each block of nD keys imposes a corresponding limit on the number of dictionaries in each of the nD dictionaries indexed by the keys. The nD dictionaries include codewords with which to encode the symbol sequences. The 1D dictionary includes a codeword for each single symbol, which guarantees a codeword can always be found. For n=2 to n=X, the nD dictionaries contain codewords for all the most likely transitions from a given key (but not the less likely transitions), as described above. Given the sequence of symbols S[t], where t denotes an index of a sequence (t=1, . . . , M), and eq. (1) represents the N-dimensional key formula, where S∈[0, 1023]: the first symbol of the sequence, S[1], is always encoded using the 1D dictionary; the second symbol, S[2], with the 2D dictionary, but if the 2D key is not found, the 1D dictionary will be used instead. That is, the 1D dictionary guarantees to find a codeword for each single symbol.

Entropy encoder 410 assists with the process of entropy encoding the symbol sequences into minimum numbers of bits while maintaining lossless data representation, such as with Huffmann coding. Each symbol sequence is replaced by a minimum number of bits. Entropy encoder 410 may concatenate the codewords of different lengths (determined based on symbol probabilities into the encoded data), such that shortest codewords are assigned to most frequent symbols and longest codewords are assigned to least frequent symbols.

In further detail, indices encoder 118 performs the reduced multidimensional compression as follows. Assume symbol sequence 402 includes an initial symbol sequence to be encoded. The initial symbol sequence includes previous symbols and a current symbol. Initially, indices encoder 118 searches the highest dimension XD keys (i.e., key block 408(X)) for a key that maps the previous symbols to one of the XD dictionaries. To do this, indices encoder 118 computes a key value for the previous symbols using eq. (1), and then searches for a match between the key value and the key in the XD keys. When the key is found, indices encoder 118 uses the current symbol to access a codeword in the one of the XD dictionaries. Indices encoder 118 encodes the current symbol using the codeword.

On the other hand, when no key is found in the XD keys (i.e., no key in key block 408(X) is found), indices encoder 118 moves to the next lower dimension X−1 and the process described above repeats in the next lower dimension. Thus, indices encoder 118 searches the (X−1)D keys (i.e., key block 408(X−1)) for a key that maps a reduced number of the previous symbols taken from the initial symbol sequence to one of the (X−1)D dictionaries. To do this, indices encoder 118 computes a key value for the reduced number of previous symbols using eq. (1), and then searches the (X−1)D keys for the key that matches that key value. When the key is found, indices encoder 118 uses the current symbol to access a codeword in the one of the (X−1)D dictionaries to which the key points. Indices encoder 118 encodes the current symbol using the codeword.

On the other hand, when no key is found in the (X−1)D keys (i.e., in key block 408(X−1)), indices encoder 118 moves to the next lower dimension X−2 and the process repeats. Generalizing this repetitive search process, beginning with dimension n=X and moving toward n=2, and beginning with an initial symbol sequence that is to be encoded, indices encoder 118 searches the nD keys (i.e., the key blocks) successively in steps of decreasing dimension n from n=X to n=2, for a key that matches previous symbols of the symbol sequence (where the number of previous symbols is shortened with each successive step). When a matching key is found, indices encoder 118 uses that key to access the corresponding dictionary, and uses the current symbol to access the codeword in that dictionary. When the 2D key is not found, the indices encoder 118 will use the 1D dictionary instead. The 1D dictionary includes a codeword for each single symbol, which guarantees a codeword can always be found. Indices encoder 118 uses the codeword to encode the current symbol in the last step of the search.

In an example, indices encoder 118 may employ a hash table of keys for which an X-digit number (i.e., a symbol sequence) serves as an input. When the X-digit key cannot be found in the hash table lookup, an X−1 digit number becomes a new input. Finding a codeword for each single symbol is guaranteed when the input reduces to a 1-digit number.

Figure 5:
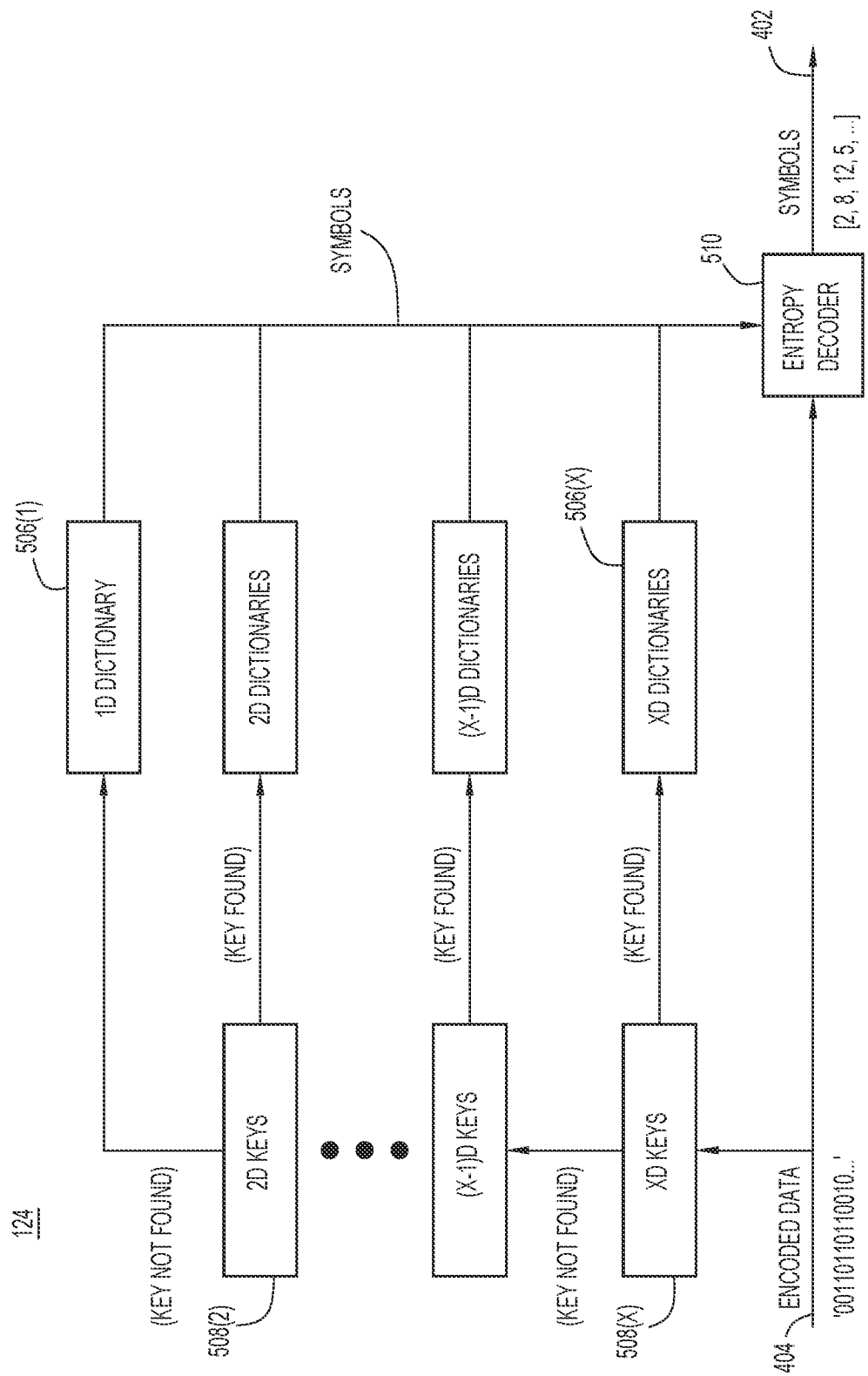
FIG. 5 is a block diagram of an indices decoder of the neural audio codec system that performs reduced multidimensional indices decompression, according to an example embodiment.

FIG. 5 is a block diagram of indices decoder 124 configured to perform the reduced multidimensional decompression according to an embodiment. Indices decoder 124 employs predefined dictionaries and keys (formatted in reverse to those of indices encoder 118) to decode encoded data 404 that is transmitted by indices encoder 118 to the indices decoder, to produce/recover symbol sequence 402. Indices decoder 124 performs reverse operations to indices encoder 118.

Indices decoder 124 includes/stores dictionaries 506(1)-506(X) (also referred to generally as "nD dictionaries," where n=1 to X), and key blocks 508(2)-508(X) (also referred to generally as "nD keys" where n=2 to X) for dictionaries 506(2)-506(X). The dictionaries used by indices encoder 118 and indices decoder are matched to each other. Indices decoder 124 also includes an entropy decoder 510. For n=2 to n=X, each set of nD keys (in key blocks 508(2)-508(X)) includes only a limited number of most frequent keys of all possible keys to map a limited number of most frequent codewords to a correspondingly limited number of most frequently used dictionaries of a corresponding one of the nD dictionaries (i.e., dictionaries 506(2)-506(X)). That is, each dimension n has a predefined set of the most frequent keys, whose number is significantly smaller than if all possible keys were to be included. For example, the 2D keys map 1 previous codeword of a 2 codeword sequence to the 2D dictionaries, the 3D keys maps a limited number of 2 previous codewords of a 3 codeword sequence to the 3D dictionaries, and so on.

The limit on the number of keys in each block of nD keys (i.e., key blocks 508(2)-508(X)) imposes a corresponding limit on the number of dictionaries in each of the nD dictionaries indexed by the keys. The nD dictionaries include symbols used to replace codewords. The 1D dictionary includes a symbol for each single codeword, which guarantees a symbol can always be found. For n=2 to n=X, the nD dictionaries contain symbols for all the most likely transitions from a given key, as described above.

Entropy decoder 510 recovers the information stored as codewords by converting them to originally encoded symbols in a lossless manner.

In operation, generally, indices decoder 124 converts codeword sequences to keys for the nD dictionaries that replace codeword sequences with the corresponding symbol. Similar to indices encoder 118, indices decoder 124 always decodes the first codeword of the sequence using the 1D dictionary, whereas the indices decoder 124 decodes the second codeword of the sequence of codewords using the 2D dictionary, but when the 2D key is not found, the indices decoder 124 will use the 1D dictionary instead.

Indices decoder 124 may employ a hash table of keys for which an X-digit number (i.e., a codeword bit sequence) serves as an input. When the X-digit key cannot be found in the hash table lookup, an X−1 digit number becomes a new input. Finding a symbol for each single codeword is guaranteed when the input reduces to a 1-digit number. Consider the following decoding example. Assume encoded data 404 (i.e., the received encoded data) includes a sequence of bits {00111 0110 1010}. The first symbol is always searched in the 1D dictionary (because indices encoder 118 always encodes the first symbol with the 1D dictionary). Also, the minimum and maximum number of bits of the 1D dictionary are known. Each codeword is unique. Assume that the minimum and maximum lengths the codeword are 2 and 10. Indices decoder 124 starts matching against 00. If 00 is found, then a symbol is found in a dictionary (the dictionary includes two columns: codeword and current symbol). If 00 is not found, the search repeats using the extended sequence 001, 0011, and so on. Finally, a match is found for 00111, and the assigned symbol, 55, is found as well. Additionally, the codewords in every dictionary may be prefix-free, such that indices decoder 124 can uniquely decode and determine the termination point in the bitstream.

The 2D dictionary is used in an attempt to decode the next symbol. The key is 55. Indices decoder checks the next sequence of bits in table 55, starting from 01. Assume a match is found for '0110' and the symbol is 4.

The 3D dictionary is used in an attempt to decode the third symbol. The key is {55, 4} which, after mapping, gives the key 1024*55+4=56324. Assume a matching key is not found in the list for 3D, so indices decoder 124 steps down to 2D. This time the key is '4'. Thus, table 4 is used to match the codeword. This matches the sequence '1010', and the symbol is 3. Thus, the decoded sequence is '55, 4, 3'.

Figure 6A:
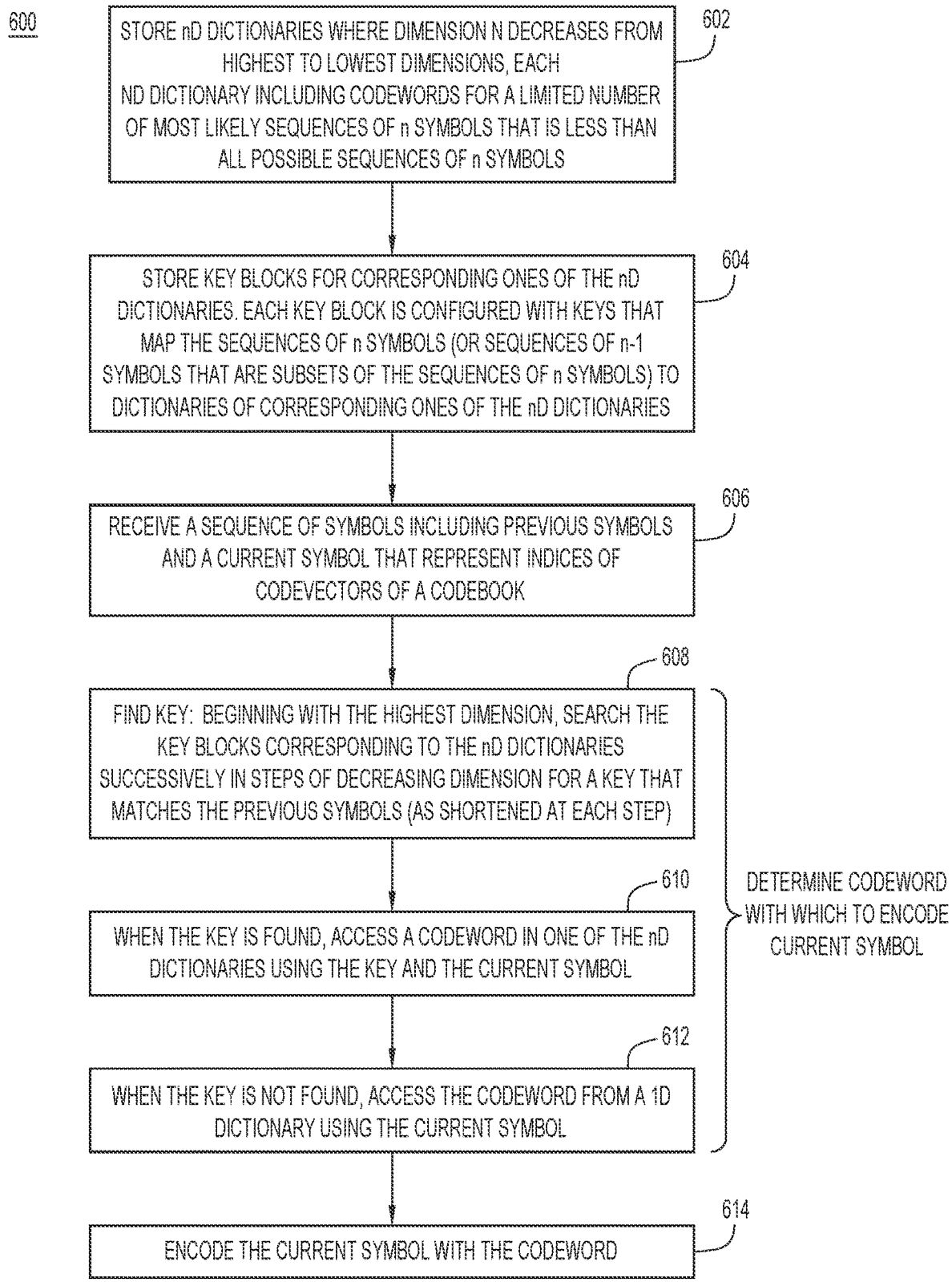
FIG. 6A is a flowchart of a method of reduced multidimensional indices compression performed by the indices encoder to encode a symbol sequence generated by vector quantizing audio vectors into symbols (i.e., codebook indices), according to an example embodiment.

FIG. 6A is a flowchart of an example method 600 of reduced multidimensional indices compression performed by indices encoder 118 to encode a sequence of symbols (i.e., a symbol sequence). The symbol sequence may be generated by vector quantizing audio vectors representative of input audio into symbols (i.e., codebook indices). Method 600 may be performed by an audio encoder of a neural audio codec system. The operations of method 600 were described above.

At 602, indices encoder 118 stores nD dictionaries, where dimension n decreases from highest to lowest dimensions (e.g., X to 1). Each nD dictionary includes codewords for a limited number of most likely n symbol sequences (i.e., sequences of n symbols) that is less than all possible n symbol sequences (i.e., all possible sequences of n symbols).

At 604, indices encoder 118 stores key blocks for corresponding ones of the nD dictionaries. Each key block is configured with keys that map only the sequences of n symbols (or, more specifically, a sequence of n−1 symbols that is a previous symbol subset of the sequence of n symbols) to dictionaries of a corresponding one of the nD dictionaries.

At 606, indices encoder 118 receives a sequence of symbols. The sequency of symbols includes a current symbol and previous symbols representing symbols of codevectors of a codebook. The goal is to encode the current symbol.

Next operations 608-612 collectively determine a codeword with which to encode the current symbol using the key blocks and the nD dictionaries.

At 608, indices encoder 118 searches for a key corresponding to (e.g., that matches) the sequence of symbols. To do this, beginning with the highest dimension, indices encoder 118 searches the key blocks corresponding to the nD dictionaries successively in steps (i.e., using search steps) of decreasing dimension (e.g., from the highest dimension to dimension 2) based on the previous symbols (e.g., as shortened at each search step), until one of the search steps finds the key that matches the previous symbols, or until the search of all the key blocks fails to find the key. Indices encoder 118 decreases the number of previous symbols at each search step.

When the search finds the key in a key block of the key blocks, at 610, indices encoder 118 accesses the codeword in one of the nD dictionaries that corresponds to the key block based on the key and the current symbol.

When the search does not find the key, at 612, indices encoder 118 accesses the codeword in a 1D dictionary, which includes a codeword for every possible symbol, based on the current symbol.

At 614, indices encoder 118 encodes the current symbol with the codeword, and transmits or stores the codeword for later use.

Figure 6B:
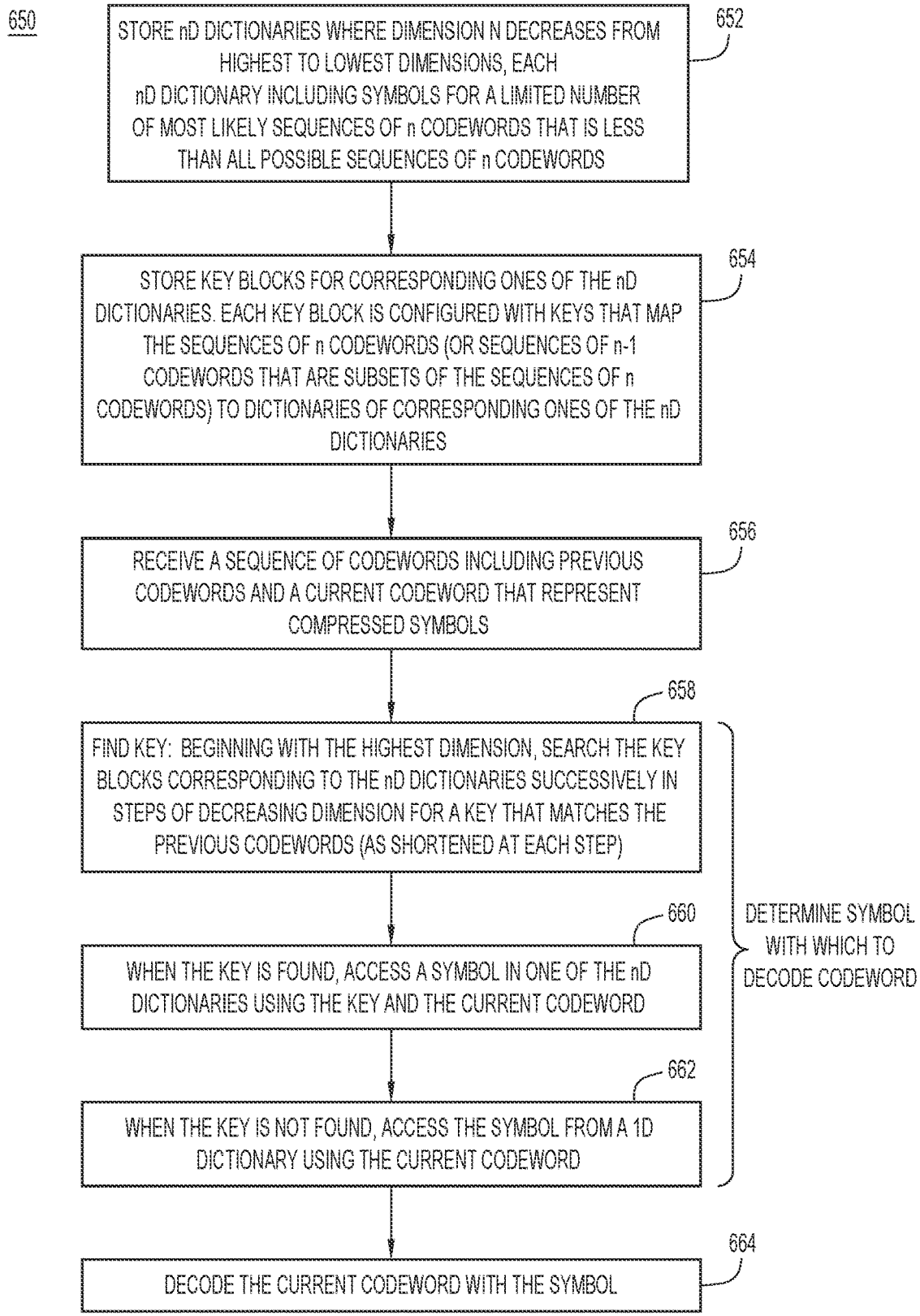
FIG. 6B is a flowchart of a method of reduced multidimensional indices decompression performed by the indices decoder of the neural audio codec system to decode a codeword sequence, according to an example embodiment.

FIG. 6B is a flowchart of an example method 650 of reduced multidimensional indices decompression performed by indices decoder 124 to decode a codeword sequence (i.e., a sequence of codewords or compressed symbols). Method 650 may be performed by an audio decoder of a neural audio codec system.

At 652, indices decoder 124 stores nD dictionaries where dimension n decreases from highest dimension to lowest dimensions. Each nD dictionary includes symbols for a limited number of most likely n codeword sequences (i.e., sequences of n codewords) that is less than all possible sequences of n codewords.

At 654, indices decoder 124 stores key blocks for corresponding ones of the nD dictionaries. Each key block is configured with keys that map only the sequences of n codewords (or a sequence of n−1 codewords that is subset of the sequence of n codewords) to dictionaries of a corresponding one of the nD dictionaries.

At 656, indices decoder 124 receives a sequence of codewords that represent compressed/encoded symbols (i.e., compressed/encoded indices). The symbols serve as indices of codevectors of a vector quantizer codebook that are representative of audio. The sequence of codewords includes previous codewords and a current codeword to be decoded.

Next operations 658-662 collectively determine a symbol with which to decode the current codeword using the key blocks and the nD dictionaries.

At 658, indices decoder 124 searches for a key corresponding to (e.g., that matches) the sequence of codewords. To do this, beginning with the highest dimension, indices decoder 124 searches the key blocks corresponding to the nD dictionaries successively in steps (i.e., using search steps) of decreasing dimension (e.g., from the highest dimension to dimension 2) based on the previous codewords (e.g., as shortened at each search step), until one of the search steps finds the key that matches the previous codewords, or until the search of all the key blocks fails to find the key. Indices decoder 124 decreases the number of previous codewords at each search step.

When searching finds the key in a key block of the key blocks, at 660, indices decoder 124 accesses the symbol in one of the nD dictionaries that corresponds to the key block based on the key and the current codeword.

When searching does not find the key, at 662, indices decoder 124 accesses the symbol in a 1D dictionary, which includes a symbol for every possible codeword, based on the current codeword.

At 664, indices decoder 124 decodes the current codeword using the symbol, and transmits or stores the symbol for later use.

Computing Device

Figure 7:
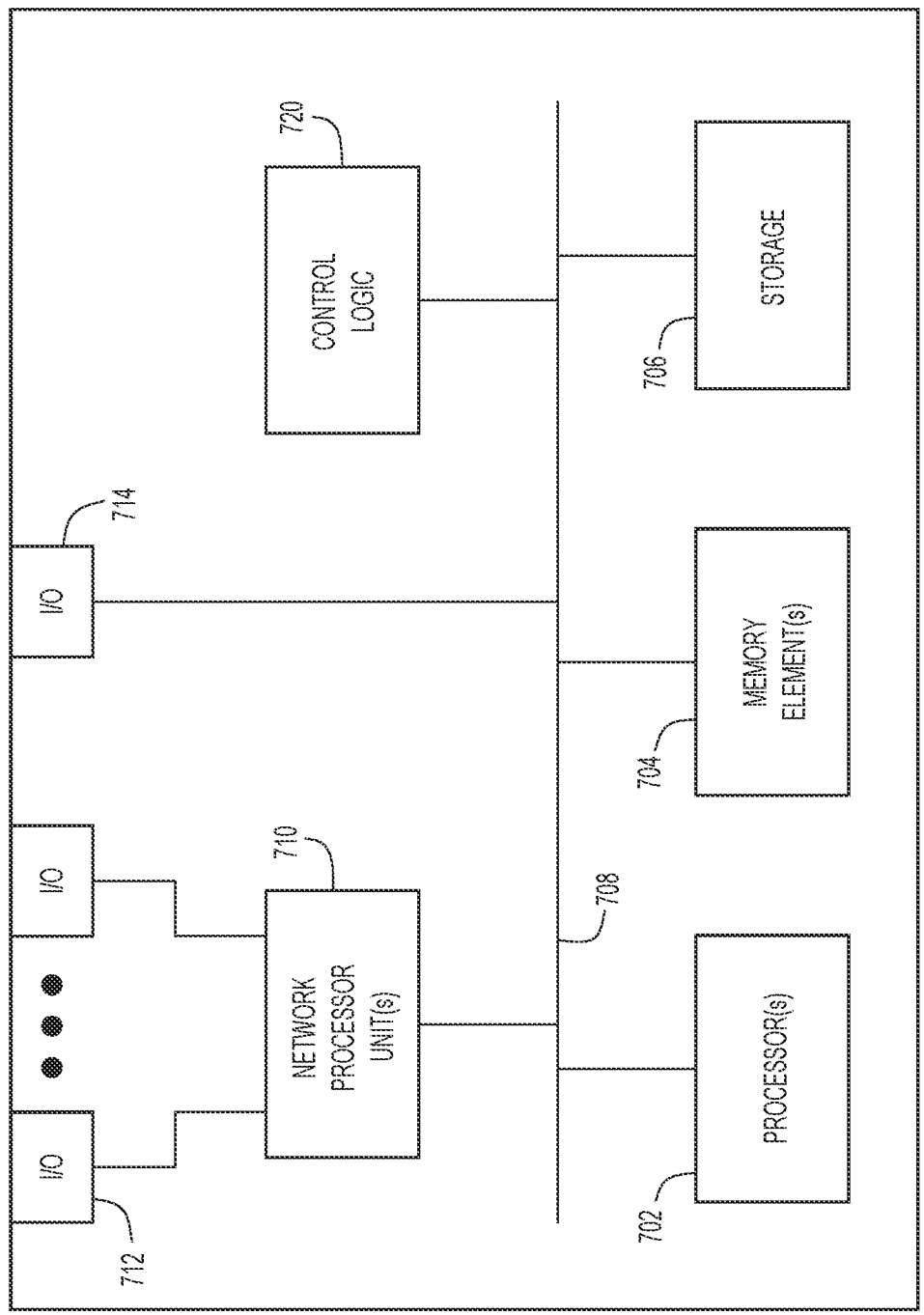
FIG. 7 illustrates a hardware block diagram of a computing device that may perform functions associated with operations discussed herein, according to an example embodiment.

Referring to FIG. 7, FIG. 7 illustrates a hardware block diagram of a computing device 700 that may perform functions associated with operations discussed herein in connection with the techniques depicted in FIGS. 1-6. In various embodiments, a computing device or apparatus, such as computing device 700 or any combination of computing devices 700, may be configured as any entity/entities as discussed for the techniques depicted in connection with FIGS. 1-6 in order to perform operations of the various techniques discussed herein. For example, computing device may represent each of the components of neural audio codec system 100 individually and/or collectively.

In at least one embodiment, the computing device 700 may be any apparatus that may include one or more processor(s) 702, one or more memory element(s) 704, storage 706, a bus 708, one or more network processor unit(s) 710 interconnected with one or more network input/output (I/O) interface(s) 712, one or more I/O interface(s) 714, and control logic 720. In various embodiments, instructions associated with logic for computing device 700 can overlap in any manner and are not limited to the specific allocation of instructions and/or operations described herein.

In at least one embodiment, processor(s) 702 is/are at least one hardware processor configured to execute various tasks, operations and/or functions for computing device 700 as described herein according to software and/or instructions configured for computing device 700. Processor(s) 702 (e.g., a hardware processor) can execute any type of instructions associated with data to achieve the operations detailed herein. In one example, processor(s) 702 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 704 and/or storage 706 is/are configured to store data, information, software, and/or instructions associated with computing device 700, and/or logic configured for memory element(s) 704 and/or storage 706. For example, any logic described herein (e.g., control logic 720) can, in various embodiments, be stored for computing device 700 using any combination of memory element(s) 704 and/or storage 706. Note that in some embodiments, storage 706 can be consolidated with memory element(s) 704 (or vice versa), or can overlap/exist in any other suitable manner.

In at least one embodiment, bus 708 can be configured as an interface that enables one or more elements of computing device 700 to communicate in order to exchange information and/or data. Bus 708 can be implemented with any architecture designed for passing control, data and/or information between processors, memory elements/storage, peripheral devices, and/or any other hardware and/or software components that may be configured for computing device 700. In at least one embodiment, bus 708 may be implemented as a fast kernel-hosted interconnect, potentially using shared memory between processes (e.g., logic), which can enable efficient communication paths between the processes.

In various embodiments, network processor unit(s) 710 may enable communication between computing device 700 and other systems, entities, etc., via network I/O interface(s) 712 (wired and/or wireless) to facilitate operations discussed for various embodiments described herein. In various embodiments, network processor unit(s) 710 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 700 and other systems, entities, etc. to facilitate operations for various embodiments described herein. In various embodiments, network I/O interface(s) 712 can be configured as one or more Ethernet port(s), Fibre Channel ports, any other I/O port(s), and/or antenna(s)/antenna array(s) now known or hereafter developed. Thus, the network processor unit(s) 710 and/or network I/O interface(s) 712 may include suitable interfaces for receiving, transmitting, and/or otherwise communicating data and/or information in a network environment.

I/O interface(s) 714 allow for input and output of data and/or information with other entities that may be connected to computing device 700. For example, I/O interface(s) 714 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 720 can include instructions that, when executed, cause processor(s) 702 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 720) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, any entity or apparatus as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 704 and/or storage 706 can store data, software, code, instructions (e.g., processor instructions), logic, parameters, combinations thereof, and/or the like used for operations described herein. This includes memory element(s) 704 and/or storage 706 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

In various example implementations, any entity or apparatus for various embodiments described herein can encompass network elements (which can include virtualized network elements, functions, etc.) such as, for example, network appliances, forwarders, routers, servers, switches, gateways, bridges, loadbalancers, firewalls, processors, modules, radio receivers/transmitters, or any other suitable device, component, element, or object operable to exchange information that facilitates or otherwise helps to facilitate various operations in a network environment as described for various embodiments herein. Note that with the examples provided herein, interaction may be described in terms of one, two, three, or four entities. However, this has been done for purposes of clarity, simplicity and example only. The examples provided should not limit the scope or inhibit the broad teachings of systems, networks, etc. described herein as potentially applied to a myriad of other architectures.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In summary, in some aspects, the techniques described herein relate to a method including: storing n dimension (nD) dictionaries (nD dictionaries) where n decreases from a highest dimension to a lowest dimension, each nD dictionary including codewords for sequences of n symbols that are of a limited number that is less than all possible sequences of n symbols; storing key blocks for corresponding ones of the nD dictionaries, each key block configured with keys that map sequences of n−1 symbols to dictionaries of a corresponding one of the nD dictionaries that includes the codewords; receiving a sequence of symbols that represent indices of codevectors of a vector quantizer codebook that are representative of audio; determining a codeword using the key blocks and the nD dictionaries; and encoding a current symbol of the sequence of symbols using the codeword.

In some aspects, the techniques described herein relate to a method, wherein: the sequences of n symbols are most likely sequences of n symbols among all the possible sequences of n symbols.

In some aspects, the techniques described herein relate to a method, wherein: the codewords for the most likely sequences of n symbols are shorter than the codewords for least likely sequences of n symbols.

In some aspects, the techniques described herein relate to a method, wherein determining includes: searching the key blocks for a key that matches previous symbols of the sequence of symbols; and when searching finds the key in a key block of the key blocks, accessing the codeword in one of the nD dictionaries that corresponds to the key block based on the key and the current symbol.

In some aspects, the techniques described herein relate to a method, wherein: the nD dictionaries include a 1D dictionary that includes a codeword for every possible symbol; and when searching does not find the key, accessing the codeword in the 1D dictionary based on the current symbol.

In some aspects, the techniques described herein relate to a method, wherein searching includes: beginning with the highest dimension, searching the key blocks corresponding to the nD dictionaries successively in steps of decreasing dimension based on the previous symbols.

In some aspects, the techniques described herein relate to a method, wherein searching further includes: decreasing a number of the previous symbols at each step of searching.

In some aspects, the techniques described herein relate to a method, further including, at each step of searching: computing a key value based on the previous symbols using a key function; and searching for a match between the key value and the key in the key block.

In some aspects, the techniques described herein relate to a method, wherein the key function includes a hash function.

In some aspects, the techniques described herein relate to a method, wherein: storing the key blocks includes storing, in each key block, a number of keys that is equal to the limited number and is less than all possible keys.

In some aspects, the techniques described herein relate to a method, wherein: the nD dictionaries further include a 1D dictionary that includes a codeword for every possible symbol.

In some aspects, the techniques described herein relate to an apparatus including: a network input/output interface to communicate with a network; and a processor coupled to the network input/output interface and configured to perform: storing n dimension (nD) dictionaries (nD dictionaries) where n decreases from a highest dimension to a lowest dimension, each nD dictionary including codewords for sequences of n symbols that are of a limited number that is less than all possible sequences of n symbols; storing key blocks for corresponding ones of the nD dictionaries, each key block configured with keys that map sequences of n−1 symbols to dictionaries of a corresponding one of the nD dictionaries that includes the codewords; receiving a sequence of symbols that represent indices of codevectors of a vector quantizer codebook that are representative of audio; determining a codeword using the key blocks and the nD dictionaries; and encoding a current symbol of the sequence of symbols using the codeword.

In some aspects, the techniques described herein relate to an apparatus, wherein: the sequences of n symbols are most likely sequences of n symbols among all the possible sequences of n symbols.

In some aspects, the techniques described herein relate to an apparatus, wherein: the codewords for the most likely sequences of n symbols are shorter than the codewords for least likely sequences of n symbols.

In some aspects, the techniques described herein relate to an apparatus, wherein the processor is configured to perform determining by: searching the key blocks for a key that matches previous symbols of the sequence of symbols; and when searching finds the key in a key block of the key blocks, accessing the codeword in one of the nD dictionaries that corresponds to the key block based on the key and the current symbol.

In some aspects, the techniques described herein relate to an apparatus, wherein: the nD dictionaries include a 1D dictionary that includes a codeword for every possible symbol, and the processor is further configured to perform: when searching does not find the key, accessing the codeword in the 1D dictionary based on the current symbol.

In some aspects, the techniques described herein relate to an apparatus, wherein the processor is configured to perform searching by: beginning with the highest dimension, searching the key blocks corresponding to the nD dictionaries successively in steps of decreasing dimension based on the previous symbols.

In some aspects, the techniques described herein relate to a non-transitory computer medium encoded with instructions that, when executed by a processor, cause the processor to perform: storing n dimension (nD) dictionaries (nD dictionaries) where n decreases from a highest dimension to a lowest dimension, each nD dictionary including codewords for sequences of n symbols that are of a limited number that is less than all possible sequences of n symbols; storing key blocks for corresponding ones of the nD dictionaries, each key block configured with keys that map sequences of n−1 symbols to dictionaries of a corresponding one of the nD dictionaries that includes the codewords; receiving a sequence of symbols that represent indices of codevectors of a vector quantizer codebook that are representative of audio; determining a codeword using the key blocks and the nD dictionaries; and encoding a current symbol of the sequence of symbols using the codeword.

In some aspects, the techniques described herein relate to a non-transitory computer medium, wherein: the sequences of n symbols are most likely sequences of n symbols among all the possible sequences of n symbols.

In some aspects, the techniques described herein relate to a non-transitory computer medium, wherein: the codewords for the most likely sequences of n symbols are shorter than the codewords for least likely sequences of n symbols.

In some aspects, the techniques described herein relate to a method including: storing n dimension (nD) dictionaries (nD dictionaries) where n decreases from a highest dimension to a lowest dimension, each nD dictionary including symbols for sequences of n codewords that are of a limited number that is less than all possible sequences of n codewords; storing key blocks for corresponding ones of the nD dictionaries, each key block configured with keys that map sequences of n−1 codewords to dictionaries of a corresponding one of the nD dictionaries that includes the symbols; receiving a sequence of codewords that represent encoded symbols that are encoded indices of codevectors of a vector quantizer codebook that are representative of audio; determining a symbol using the key blocks and the nD dictionaries; and decoding a current codeword in the sequence of codewords using the symbol.

In some aspects, the techniques described herein relate to a method, wherein: the sequences of n codewords are most likely sequences of n codewords among all the possible sequences of n codewords.

In some aspects, the techniques described herein relate to a method, wherein determining includes: searching the key blocks for a key that matches previous codewords of the sequence of codewords; and when searching finds the key in a key block of the key blocks, accessing the symbol in one of the nD dictionaries that corresponds to the key block based on the key and the current codeword.

In some aspects, the techniques described herein relate to a method, wherein: the nD dictionaries include a 1D dictionary that includes a symbol for every possible codeword; and when searching does not find the key, accessing the symbol in the 1D dictionary based on the current codeword.

In some aspects, the techniques described herein relate to a method, wherein finding includes: beginning with the highest dimension, searching the key blocks corresponding to the nD dictionaries successively in steps of decreasing dimension based on the previous codewords.

In some aspects, the techniques described herein relate to a method, wherein searching further includes: decreasing a number of the previous codewords at each step of searching.

In some aspects, the techniques described herein relate to a method, further including, at each step of searching: computing a key value based on the previous codewords using a key function; and searching for a match between the key value and the key in the key block.

In some aspects, the techniques described herein relate to a method, wherein the key function includes a hash function.

In some aspects, the techniques described herein relate to a method, wherein: storing the key blocks includes storing, in each key block, a number of keys that is equal to the limited number and is less than all possible keys.

In some aspects, the techniques described herein relate to a method, wherein: the nD dictionaries include a 1D dictionary that includes a symbol for every possible codeword.

In some aspects, the techniques described herein relate to an apparatus including: a network input/output interface to communicate with a network; and a processor coupled to the network input/output interface and configured to perform: storing n dimension (nD) dictionaries (nD dictionaries) where n decreases from a highest dimension to a lowest dimension, each nD dictionary including symbols for sequences of n codewords that are of a limited number that is less than all possible sequences of n codewords; storing key blocks for corresponding ones of the nD dictionaries, each key block configured with keys that map sequences of n−1 codewords to dictionaries of a corresponding one of the nD dictionaries that includes the symbols; receiving a sequence of codewords that represent encoded symbols that are encoded indices of codevectors of a vector quantizer codebook that are representative of audio; determining a symbol using the key blocks and the nD dictionaries; and decoding a current codeword in the sequence of codewords using the symbol.

In some aspects, the techniques described herein relate to an apparatus, wherein: the sequences of n codewords are most likely sequences of n codewords among all the possible sequences of n codewords.

In some aspects, the techniques described herein relate to an apparatus, wherein the processor is configured to perform determining by: searching the key blocks for a key that matches previous codewords of the sequence of codewords; and when searching finds the key in a key block of the key blocks, accessing the symbol in one of the nD dictionaries that corresponds to the key block based on the key and the current codeword.

In some aspects, the techniques described herein relate to an apparatus, wherein the nD dictionaries include a 1D dictionary that includes a symbol for every possible codeword, and the processor is further configured to perform: when searching does not find the key, accessing the symbol in the 1D dictionary based on the current codeword.

In some aspects, the techniques described herein relate to an apparatus, wherein the processor is configured to perform searching by: beginning with the highest dimension, searching the key blocks corresponding to the nD dictionaries successively in steps of decreasing dimension based on the previous codewords.

In some aspects, the techniques described herein relate to an apparatus, wherein the processor is configured to perform searching by: decreasing a number of the previous codewords at each step of searching.

In some aspects, the techniques described herein relate to an apparatus, wherein the processor is further configured to perform, at each step of searching: computing a key value based on the previous codewords using a key function; and searching for a match between the key value and the key in the key block.

In some aspects, the techniques described herein relate to a non-transitory computer medium encoded with instructions that, when executed by a processor, cause the processor to perform: storing n dimension (nD) dictionaries (nD dictionaries) where n decreases from a highest dimension to a lowest dimension, each nD dictionary including symbols for sequences of n codewords that are of a limited number that is less than all possible sequences of n codewords; storing key blocks for corresponding ones of the nD dictionaries, each key block configured with keys that map sequences of n−1 codewords to dictionaries of a corresponding one of the nD dictionaries that includes the symbols; receiving a sequence of codewords that represent encoded symbols that are encoded indices of codevectors of a vector quantizer codebook that are representative of audio; determining a symbol using the key blocks and the nD dictionaries; and decoding a current codeword in the sequence of codewords using the symbol.

In some aspects, the techniques described herein relate to a non-transitory computer medium, wherein: the sequences of n codewords are most likely sequences of n codewords among all the possible sequences of n codewords.

In some aspects, the techniques described herein relate to a non-transitory computer medium, wherein the instructions to cause the processor to perform determining include instructions to cause the processor to perform: searching the key blocks for a key that matches previous codewords of the sequence of codewords; and when searching finds the key in a key block of the key blocks, accessing the symbol in one of the nD dictionaries that corresponds to the key block based on the key and the current codeword.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   storing n dimension (nD) dictionaries (nD dictionaries) where n decreases from a highest dimension to a lowest dimension, each nD dictionary including codewords for sequences of n symbols that are of a limited number that is less than all possible sequences of n symbols;
   storing key blocks for corresponding ones of the nD dictionaries, each key block configured with keys that map sequences of n−1 symbols to dictionaries of a corresponding one of the nD dictionaries that includes the codewords;
   receiving a sequence of symbols that represent indices of codevectors of a vector quantizer codebook that are representative of audio;
   determining a codeword using the key blocks and the nD dictionaries; and
   encoding a current symbol of the sequence of symbols using the codeword.

2. The method of claim 1, wherein:
   the sequences of n symbols are most likely sequences of n symbols among all the possible sequences of n symbols.

3. The method of claim 2, wherein:
   the codewords for the most likely sequences of n symbols are shorter than the codewords for least likely sequences of n symbols.

4. The method of claim 1, wherein determining includes:
   searching the key blocks for a key that matches previous symbols of the sequence of symbols; and
   when searching finds the key in a key block of the key blocks, accessing the codeword in one of the nD dictionaries that corresponds to the key block based on the key and the current symbol.

5. The method of claim 4, wherein:
   the nD dictionaries include a 1D dictionary that includes a codeword for every possible symbol; and
   when searching does not find the key, accessing the codeword in the 1D dictionary based on the current symbol.

6. The method of claim 4, wherein searching includes:
   beginning with the highest dimension, searching the key blocks corresponding to the nD dictionaries successively in steps of decreasing dimension based on the previous symbols.

7. The method of claim 6, wherein searching further includes:
   decreasing a number of the previous symbols at each step of searching.

8. The method of claim 4, further comprising, at each step of searching:
   computing a key value based on the previous symbols using a key function; and
   searching for a match between the key value and the key in the key block.

9. The method of claim 8, wherein the key function includes a hash function.

10. The method of claim 1, wherein:
    storing the key blocks includes storing, in each key block, a number of keys that is equal to the limited number and is less than all possible keys.

11. The method of claim 1, wherein:
    the nD dictionaries further include a 1D dictionary that includes a codeword for every possible symbol.

12. An apparatus comprising:
    a network input/output interface to communicate with a network; and
    a processor coupled to the network input/output interface and configured to perform:
       storing n dimension (nD) dictionaries (nD dictionaries) where n decreases from a highest dimension to a lowest dimension, each nD dictionary including codewords for sequences of n symbols that are of a limited number that is less than all possible sequences of n symbols;
       storing key blocks for corresponding ones of the nD dictionaries, each key block configured with keys that map sequences of n−1 symbols to dictionaries of a corresponding one of the nD dictionaries that includes the codewords;

receiving a sequence of symbols that represent indices of codevectors of a vector quantizer codebook that are representative of audio;

determining a codeword using the key blocks and the nD dictionaries; and encoding a current symbol of the sequence of symbols using the codeword.

13. The apparatus of claim 12, wherein:
the sequences of n symbols are most likely sequences of n symbols among all the possible sequences of n symbols.

14. The apparatus of claim 13, wherein:
the codewords for the most likely sequences of n symbols are shorter than the codewords for least likely sequences of n symbols.

15. The apparatus of claim 12, wherein the processor is configured to perform determining by:
searching the key blocks for a key that matches previous symbols of the sequence of symbols; and
when searching finds the key in a key block of the key blocks, accessing the codeword in one of the nD dictionaries that corresponds to the key block based on the key and the current symbol.

16. The apparatus of claim 15, wherein the nD dictionaries include a 1D dictionary that includes a codeword for every possible symbol, and the processor is further configured to perform:
when searching does not find the key, accessing the codeword in the 1D dictionary based on the current symbol.

17. The apparatus of claim 15, wherein the processor is configured to perform searching by:
beginning with the highest dimension, searching the key blocks corresponding to the nD dictionaries successively in steps of decreasing dimension based on the previous symbols.

18. A method comprising:
storing n dimension (nD) dictionaries (nD dictionaries) where n decreases from a highest dimension to a lowest dimension, each nD dictionary including symbols for sequences of n codewords that are of a limited number that is less than all possible sequences of n codewords;
storing key blocks for corresponding ones of the nD dictionaries, each key block configured with keys that map sequences of n−1 codewords to dictionaries of a corresponding one of the nD dictionaries that includes the symbols;

receiving a sequence of codewords that represent encoded symbols that are encoded indices of codevectors of a vector quantizer codebook that are representative of audio;

determining a symbol using the key blocks and the nD dictionaries; and decoding a current codeword in the sequence of codewords using the symbol.

19. The method of claim 18, wherein:
the sequences of n codewords are most likely sequences of n codewords among all the possible sequences of n codewords.

20. The method of claim 18, wherein determining includes:
searching the key blocks for a key that matches previous codewords of the sequence of codewords; and
when searching finds the key in a key block of the key blocks, accessing the symbol in one of the nD dictionaries that corresponds to the key block based on the key and the current codeword.

21. The method of claim 20, wherein:
the nD dictionaries include a 1D dictionary that includes a symbol for every possible codeword; and
when searching does not find the key, accessing the symbol in the 1D dictionary based on the current codeword.

22. The method of claim 20, wherein finding includes:
beginning with the highest dimension, searching the key blocks corresponding to the nD dictionaries successively in steps of decreasing dimension based on the previous codewords.

23. The method of claim 22, wherein searching further includes:
decreasing a number of the previous codewords at each step of searching.

24. The method of claim 20, further comprising, at each step of searching:
computing a key value based on the previous codewords using a key function; and
searching for a match between the key value and the key in the key block.

25. The method of claim 24, wherein the key function includes a hash function.

26. The method of claim 18, wherein:
storing the key blocks includes storing, in each key block, a number of keys that is equal to the limited number and is less than all possible keys.

27. The method of claim 18, wherein:
the nD dictionaries include a 1D dictionary that includes a symbol for every possible codeword.

* * * * *